United States Patent
Wang

(10) Patent No.: US 6,569,602 B1
(45) Date of Patent: May 27, 2003

(54) IONIZATION RADIATION IMAGEABLE PHOTOPOLYMER COMPOSITIONS

(75) Inventor: Ying Wang, Wilmington, DE (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 09/314,435

(22) Filed: May 18, 1999

Related U.S. Application Data

(60) Provisional application No. 60/103,067, filed on Oct. 5, 1998.

(51) Int. Cl.⁷ .................. G03C 1/725; G03C 1/73; G03F 7/027; G03F 7/033; G03F 7/037
(52) U.S. Cl. .................. 430/281.1; 430/280.1; 430/283.1; 430/284.1; 430/285.1; 430/905; 430/906; 430/907; 430/909; 430/910; 430/966; 430/967; 430/942; 430/953
(58) Field of Search .................. 430/283.1, 284.1, 430/285.1, 281.1, 280.1, 905, 906, 907, 909, 910, 926, 84, 966, 967, 942, 953

(56) References Cited

U.S. PATENT DOCUMENTS

| | | | |
|---|---|---|---|
| 3,772,027 A | * 11/1973 | Luckey et al. | 430/495.1 |
| 3,841,401 A | 10/1974 | Restaino et al. | 166/247 |
| 3,869,285 A | * 3/1975 | Kondo et al. | 430/49 |
| 3,943,103 A | 3/1976 | Borden et al. | 260/47 |
| 3,950,238 A | 4/1976 | Eldred | 204/159.15 |
| 4,004,997 A | 1/1977 | Tsukamoto et al. | 204/159 |
| 4,115,339 A | 9/1978 | Restaino | 260/29.6 |
| 4,273,632 A | 6/1981 | Zarnegar | 204/159.15 |
| 4,294,782 A | 10/1981 | Froehlig | 264/1.4 |
| 4,303,696 A | 12/1981 | Brack | 427/44 |
| 4,316,952 A | * 2/1982 | Wendling | 430/285.1 |
| 4,319,811 A | 3/1982 | Tu et al. | 351/166 |
| 4,319,942 A | 3/1982 | Brenner | 156/72 |
| 4,353,961 A | 10/1982 | Gotcher et al. | 428/380 |
| 4,457,766 A | 7/1984 | Caul | 51/298 |
| 4,547,204 A | 10/1985 | Caul | 51/298 |
| 4,643,730 A | 2/1987 | Chen et al. | 604/390 |
| 5,037,667 A | 8/1991 | Dubrow et al. | 427/44 |
| 5,098,982 A | 3/1992 | Long, II | 121/56 |
| 5,238,607 A | 8/1993 | Herron et al. | 252/518 |
| 5,332,769 A | 7/1994 | Kakimoto et al. | 523/513 |
| 5,468,820 A | 11/1995 | Dougherty et al. | 526/264 |
| 5,487,966 A | 1/1996 | Steinmann et al. | 430/269 |
| 5,556,716 A | 9/1996 | Herron et al. | 428/688 |
| 5,562,951 A | 10/1996 | Kamen | 427/493 |
| 5,767,169 A | * 6/1998 | Leppard et al. | 430/281.1 |
| 6,071,667 A | * 6/2000 | Hagiwara et al. | 430/270.1 |

FOREIGN PATENT DOCUMENTS

| | | | |
|---|---|---|---|
| EP | 0 414 166 A2 | 2/1991 | G03F/7/004 |
| EP | 0 414 167 A2 | 2/1991 | G03F/7/004 |
| EP | 0 414 168 A2 | 2/1991 | G03F/7/004 |
| EP | 0 414 169 A2 | 2/1991 | G03F/7/004 |
| GB | 1463900 | * 2/1977 | |
| GB | 1 489 467 | 10/1977 | C08F/2/50 |

OTHER PUBLICATIONS

B. Baysal, G. Adler, D. Ballantine, and P. Colombo, Solid State Polymerization of Acrylamide Initiated by Gamma Radiation, *Journal of Polymer Science*, XLIV, 117–127, 1960.

E. D. Johnson, J. C. Milne, D. P. Siddons, H. Guckel, and J.L. Klein, Precision Machining With Hard X–Rays, *Synchrotron Radiation News Technical Reports*, 9, No. 4, 10–13, 1996.

* cited by examiner

*Primary Examiner*—Janet Baxter
*Assistant Examiner*—Sin J. Lee

(57) ABSTRACT

This invention discloses compositions that can be polymerized/crosslinked imagewise upon exposure to ionization radiation such as x-ray, electron beam, ion beam, and gamma-ray. This invention also discloses methods of use for these compositions for microfabrication of ceramics, for stereolithography, and for x-ray, e-beam, and ion-beam lithography which can be used for photoresists.

19 Claims, 4 Drawing Sheets

IONIZATION RADIATION IMAGEABLE PHOTOPOLYMER COMPOSITIONS

This application claims priority benefit of U.S. Provisional Application No. 60/103,067 filed Oct. 5, 1998.

FIELD OF THE INVENTION

This invention discloses compositions consisting essentially of (1) reactive monomer, (2) multi-functional cross-linking agent, and at least (3) radiation sensitizer, (4) polymer binder, or (5) filler (with binder) that can be polymerized/cross-linked imagewise upon exposure to ionizing radiation, such as x-ray, electron beam, ion beam, and gamma-ray. This invention also discloses methods of using these compositions for microfabrication of ceramics, for stereolithography and as photoresist in x-ray, e-beam, and ion-beam lithography.

BACKGROUND OF THE INVENTION

UV-VIS-IR-sensitive photopolymer compositions have been used extensively in many applications in the area of photolithography, graphic art, stereolithography, and printing and publishing. All of these applications require materials that can be polymerized imagewise; that is, the polymerization reaction is spatially confined to the region irradiated by the photons to retain the input image with good fidelity and spatial resolution. Because of the short penetration depth (in absorbing media) and scattering problems of optical photons, the use of relatively thin and transparent photopolymer films is usually required for these applications. Opaque medium is very problematic for this technology. For example, conventional photopolymer technology is not suitable for the patterning of ceramic materials.

These issues may be resolved by the development of useful x-ray sensitive photopolymers. X-ray has deeper penetration depth and, in the case of lithography, can achieve better spatial resolution than optical based technique. Unfortunately, no material has been developed that can be polymerized imagewise by a relatively low intensity x-ray beam within a reasonably short duration, as best known to the inventor. Organics have very low x-ray absorption coefficient and polymerization reaction, it can be initiated by x-rays, tends to be inefficient and requires the use of either very long exposure time or high power x-ray source, such as synchrotron radiation. In addition, for applications requiring spatial resolution, the polymerization reaction has to be spatially confined to the irradiated region.

There are many potential applications for x-ray sensitive photopolymers if these materials are available. The microfabrication of ceramics and metals (for example, barrier rib fabrication for plasma flat panel display; S. W. Depp and W. E. Howard, Sci. Amer. 260,40 March 1993), stereolithography (3D-solid object modeling) (D. C. Neckers, Chemtech, October issue, p. 615, 1990) and photoresist for x-ray or e-beam or ion beam lithography (C. Grant Wilson in Introduction to Microlithography, eds. L. F. Thompson, C. G. Wilson, and M. J. Bowden, 1994, American Chemical Society, Chapter 3, p.139) are just a few examples. Other applications include x-ray contact microscopy (Applied Physics Letters, 72, 258 (1998) by A. C. Cefalas, P. Argitis, Z. Kollia, E. Sarantopoulou, T. W. Ford, A. D. Stead, A. Marranca, C. N. Danson, J. Knott, and D. Neely) and the fabrication of photonic crystals with photonic band gap properties (Science, 281, 802 (1998), by J. E. G. J. Wijnhoven and W. L. Vos).

The basic principles of initiating chemical reactions with ionization radiation can be found in "Radiation Chemistry" by A. J. Swallow, Wiley, 1973; and "Pulse Radiolysis" by M. S. Matheson and L. M. Dorfman, MIT Press, 1969. Here ionization radiation is defined to include x-rays, γ-rays, neutrons, charged particles (ion beam), and electron beam. The irradiation of matters with ionization radiation can generate excited states; free radicals, cations, and anions. Under the proper conditions, these reactive species can initiate chemical reactions such as polymerization, cross-linking, and bond breaking.

Several patents disclose the use of gamma ray radiation for industrial applications. U.S. Pat. No. 3,950,238 (Apr. 13, 1976, R. J. Eldred) discloses an acrylonitrile-butadiene elastomer composition that can be cured by an electron beam. U.S. Pat. No. 4,004,997 (Jan. 25, 1977, Tsukamoto, Matsumura, Sano) discloses a process of curing a resin filled with powdery ferromagnetic substance using radioactive rays. U.S. Pat. No. 4,303,696 (Dec. 1, 1981, Brack) describes a method of curing a liquid prepolymer composition to form a waxy, release coating on a solid surface. U.S. Pat. No. 4,319,942 (Mar. 16, 1982, W. Brenner) discloses electron beam curing of adhesive compositions containing elastomers for building flocked composite structures. U.S. Pat. No. 4,353,961 (Oct. 12, 1982, Gotcher, Germeraad) discloses radiation cross-linking of fluorocarbon polymer to improve the mechanical strength. U.S. Pat. No. 4,547,204 (Oct. 15, 1985, Caul) discloses resin compositions, such as acrylated epoxy and phenolic resin, which can be cured by electron beam for coated abrasive application. U.S. Pat. No. 5,098,982 (Mar. 24, 1992, Long) discloses that the hardness of thermoplastic polyurethanes can be improved upon irradiation by electron beam. U.S. Pat. No. 5,037,667 (Aug. 6, 1991, Dubrow, Dittmer) discloses that certain organopolysiloxanes can be grafted to polymeric supports by the irradiation with electron beams. U.S. Pat. No. 5,332,769 (Jul. 26, 1994, Kakimoto, Eguchi, Kobayashi, Nishimoto, Iseki, Maruyama) discloses electron beam curing of adhesives for adhesion between a polyester film and a metal plate. J. Polym. Sci., XLIV, 117–127(1960) by B. Baysal, G. Adler, D. Ballantine, and P. Colombo discloses solid state polymerization of acrylamide initiated by gamma ray radiation to produce polyacrylamide. There was not enough solubility differentiation between the starting material and the product to allow spatially defined image formation. U.S. Pat. No. 4,115,339 (Sep. 19, 1978, by A. J. Restaino) discloses gamma ray initiated polymerization of nitrogen-containing vinyl monomers to form aqueous gels of water-soluble polymers. Both the starting material and the product are water-soluble so spatially defined image formation cannot be achieved.

All of the above patents and papers disclose methods or compositions used mostly for coating and adhesion applications under gamma ray radiation. The efficiency was generally low and the required spatial resolution for imaging applications was not demonstrated.

Recently, synchrotron radiation has been used to cross link polymethylmethacrylate for the precision machining of solid parts (Johnson, Milne, Siddons, Guckel, Klain, Synchrotron Radiation News, 9, 10 (1996)). The intensity of synchrotron radiation is roughly 1 million times higher than the common laboratory x-ray machines such as the ones used in this work. The extremely high intensity of the synchrotron radiation means the polymerization/cross-linking reactions can be initiated from almost any compositions (that is, it is non-discriminate). The high intensity also presents damage and heating problems with the mask that needs to be used for imaging applications. Because of the cost of the synchrotron machine and the limited availability, the use of synchrotron radiation is not practical. The compositions disclosed in this invention allow the use of commonly available, low intensity x-ray machine (or e-beam and gamma ray) to achieve spatially defined polymerization/cross-linking reactions.

U.S. Pat. No. 5,556,716 (Herron and Wang) discloses x-ray sensitive photo-conductive compositions for digital radiography applications. The compositions comprise of hybrids of organic polymers and inorganic nanoparticles. Unlike the materials disclosed in the present invention, x-ray generated electrons and holes in these photoconductors do not induce any chemical reactions; they are separated and transported out of the film under high fields.

SUMMARY OF THE INVENTION

This invention discloses compositions that can be polymerized/cross-linked imagewise upon exposure to ionizing radiation such as x-ray, electron beam, ion beam, and gamma ray.

One of the disclosures of this invention is a composition, that can be polymerized/cross-linked imagewise by ionization radiation, consisting essentially of:

(A) from 10 to 90 weight percent of a reactive monomer having at least one amide functional group, said monomer selected from the group consisting of:

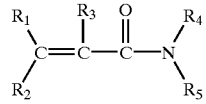

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

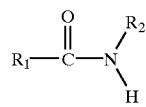

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and acetamide;

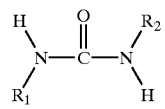

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

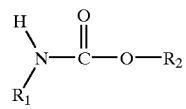

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone with at least 2 functional groups, said backbone is selected from group consisting of:
  (1) linear or branched aliphatic chains, —(CRH)$_n$—, n=1–1000, where R represents an aliphatic group, $C_nH_{2n+1}$ and $C_nH_{2n-1}$ (n=1 to 20);
  (2) ethylene glycol chains, —(CH$_2$CH$_2$O)$_n$— where n=1–1000;
  (3) propylene glycol chains, —(CH(CH$_3$)CH$_2$O)$_n$— where n=1–1000;
  (4) cyclohexyl; and
  (5) isocyanurate, $C_3N_3O_3$; and
  wherein the functional groups are selected from the group consisting of:
  (a) acrylates,

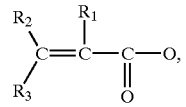

where $R_1$, $R_2$, and $R_3$ are selected from the group consisting of hydrogen and aliphatic groups, $C_nH_{2n+1}$ and $C_nH_{2n-1}$ (n=1 to 20);
  (b) carboxylic acid, —COOH;
  (c) epoxides,

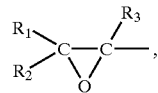

where $R_1$, $R_2$, and $R_3$ are selected from: hydrogen or aliphatic groups, $C_nH_{2n+1}$ and $C_nH_{2n-1}$ (n=1 to 20); and
  (d) vinyls,

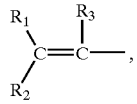

where $R_1$, $R_2$, and $R_3$ are selected from: hydrogen or aliphatic groups, $C_nH_{2n+1}$ and $C_nH_{2n-1}$ (n=1 to 20); and (C) from 0.1 to 80 weight percent of an inorganic radiation sensitizer having a particle size in the range of 1 nanometer to 1000 nanometers, said radiation sensitizer is selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors.

This invention also discloses a composition, that can be polymerized/cross-linked imagewise by ionization radiation, consisting essentially of:

(A) from 10 to 90 weight percent of a reactive monomer having at least one amide functional group, said monomer selected from the group consisting of:

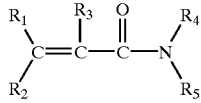

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2-1}$ (n=1 to 20);

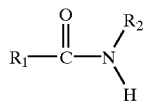

where $R_1$ and $R_2$ are selected from the group consisting of hydrogen; aliphatic a groups $C_nH_{2n+1}$ and $C_nH_{2n-1}$ (n=1 to 20); unsaturated aliphatic groups $C_nH_{2n-1}$ (n=1 to 20); and acetamide;

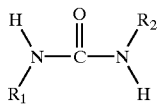

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

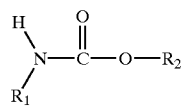

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone with at least 2 functional groups, said backbone is selected from the group consisting of:
(1) linear or branched aliphatic chains, —(CRH)$_n$—, n=1–1000, where R represents an aliphatic group, $C_nH_{2n+1}$ and $C_nH_{2n-1}$ (n=1 to 20);
(2) ethylene glycol chains, —(CH$_2$CH$_2$O)$_n$— where n=1–1000;
(3) propylene glycol chains, —(CH(CH$_3$)CH$_2$O)$_n$— where n=1–1000;
(4) cyclohexyl; and
(5) isocyanurate, $C_3N_3O_3$; and wherein the functional groups are selected from the group consisting of:
(a) acrylates,

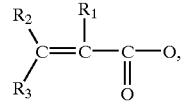

where $R_1$, $R_2$, and $R_3$ are selected from the group consisting of hydrogen and aliphatic groups, $C_nH_{2n+1}$ and $C_nH_{2n-1}$ (n=1 to 20);
(b) carboxylic acid, —COOH;
(c) epoxides,

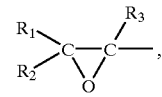

where $R_1$, $R_2$, and $R_3$ are selected from: hydrogen or aliphatic groups, $C_nH_{2n+1}$ and $C_nH_{2n-1}$ (n=1 to 20); and
(d) vinyls,

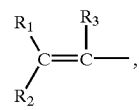

where $R_1$, $R_2$, and $R_3$ are selected from: hydrogen or aliphatic groups, $C_nH_{2n+1}$ and $C_nH_{2n-1}$ (n=1 to 20);

(C) from 0.1 to 80 weight percent of an inorganic radiation sensitizer having a particle size in the range of 1 nanometer to 1000 nanometers, said radiation sensitizer is selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors; and (D) 5 to 90 weight percent of a polymer.

Additionally, this invention discloses a composition, that can be polymerized/cross-linked imagewise by ionization radiation, consisting essentially of:

(A) from 10 to 90 weight percent of a reactive monomer having at least one amide functional group, said monomer selected from the group consisting of:

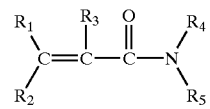

where $R_1$, $R_2$, $R_3$, $R_4$ and $R_5$ are selected from the group consisting of hydrogen; aliphatic groups $C_nH_2H+_1$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

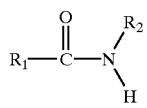

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and acetamide;

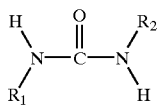

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

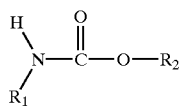

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone with at least 2 functional groups, said backbone is selected from the group consisting of:

(1) linear or branched aliphatic chains, —(CRH)$_n$—, n=1–1000, where R represents an aliphatic group, $C_nH_{2n+1}$ and $C_nH_{2n-1}$ (n=1 to 20);

(2) ethylene glycol chains, —(CH$_2$CH$_2$O)$_n$— where n=1–1000;

(3) propylene glycol chains, —(CH(CH$_3$)CH$_2$O)$_n$— where n=1–1000;

(4) cyclohexyl; and (5) isocyanurate, $C_3N_3O_3$; and wherein the functional groups are selected from the group consisting of:

(a) acrylates,

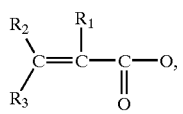

where $R_1$, $R_2$, and $R_3$ are selected from the group consisting of hydrogen and aliphatic groups, $C_nH_{2n+1}$ and $C_nH_{2n-1}$ (n=1 to 20);

(b) carboxylic acid, —COOH;

(c) epoxides,

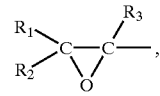

where $R_1$, $R_2$, and $R_3$ are selected from: hydrogen or aliphatic groups, $C_nH_{2n+1}$ and $C_nH_{2n-1}$ (n=1 to 20); and (d) vinyls,

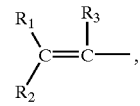

where $R_1$, $R_2$, and $R_3$ are selected from: hydrogen or aliphatic groups, $C_nH_{2n+1}$ and $C_nH_{2n-1}$ (n=1 to 20);

(C) from 0.1 to 80 weight percent of an inorganic radiation sensitizer having a particle size in the range of 1 nanometer to 1000 nanometers, said radiation sensitizer is selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors;

(D) 5 to 90 weight percent of a polymer binder; and (E) 5 to 90 weight percent of metallic particle or ceramic oxide fillers, said metallic filler is selected from group consisting of Al, Ti, V, Cu, Mn, Fe, Co, Ni, Cu, Zn, Y, Zr, Nb, Mo, In, and Sb; said oxide filler is selected from the group consisting of Al, Ti, V, Cu, Mn, Fe, Co, Ni, Cu, Zn, Y, Zr, Nb, Mo, In, Sb, Ta, W, and Si.

Another disclosure of this invention is a composition that can be polymerized/cross-linked imagewise by ionization radiation consisting essentially of:

(A) from 10 to 90 weight percent of a reactive monomer having at least one amide functional group, said monomer selected from the group consisting of:

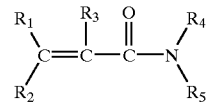

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

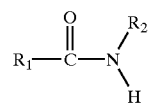

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and acetamide;

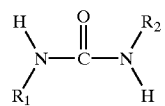

where $R_1$ and $R_2$ are selected from the group consisting of hydrogen; aliphatic groups $C_nH_{2n+1}$ and $C_nH_{2n+1}$ (n=1 to 20); and unsaturated aliphatic groups $C_nH_{2n-1}$ (n=1 to 20);

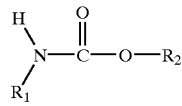

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone with at least 2 functional groups, said backbone is selected from the group consisting of:

(1) linear or branched aliphatic chains, —(CRH)$_n$—, n=1–1000, where R represents an aliphatic group, $C_nH_{2n+1}$ and $C_nH_{2n-1}$ (n=1 to 20);

(2) ethylene glycol chains, —(CH$_2$CH$_2$O)$_n$— where n=1–1000;

(3) propylene glycol chains, —(CH(CH$_3$)CH$_2$O)$_n$— where n=1–1000;

(4) cyclohexyl; and (5) isocyanurate, $C_3N_3O_3$; and wherein the functional groups are selected from the group consisting of:

(a) acrylates,

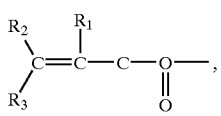

where $R_1$, $R_2$, and $R_3$ are selected from the group consisting of hydrogen and aliphatic groups, $C_nH_{2n+1}$ and $C_nH_{2n-1}$ (n=1 to 20);

(b) carboxylic acid, —COOH;

(c) epoxides,

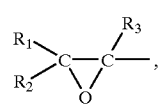

where $R_1$, $R_2$, and $R_3$ are selected from: hydrogen or aliphatic groups, $C_nH_{2n+1}$ and $C_nH_{2n-1}$ (n=1 to 20); and (d) vinyls,

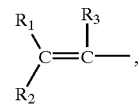

where $R_1$, $R_2$, and $R_3$ are selected from: hydrogen or aliphatic groups, $C_nH_{2n+1}$ and $C_nH_{2n-1}$ (n=1 to 20); and (C) 5 to 90 weight percent of a polymer binder.

A further disclosure of this invention is a composition, that can be polymerized/cross-linked imagewise by ionization radiation, consisting essentially of:

(A) from 10 to 90 weight percent of a reactive monomer having at least one amide functional group, said monomer selected from the group consisting of:

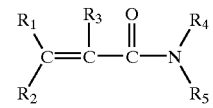

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

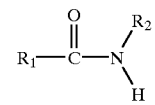

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and acetamide;

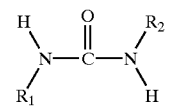

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

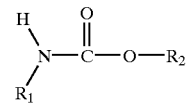

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone with at least 2 functional groups, said backbone is selected from the group consisting of:

(1) linear or branched aliphatic chains, —(CRH)$_n$—, n=1–1000, where R represents an aliphatic group, $C_nH_{2n+1}$ and $C_nH_{2n-1}$ (n=1 to 20);
(2) ethylene glycol chains, —(CH$_2$CH$_2$O)$_n$— where n=1–1000;
(3) propylene glycol chains, —(CH(CH$_3$)CH$_2$O)$_n$— where n=1–1000;
(4) cyclohexyl; and
(5) isocyanurate, $C_3N_3O_3$; and wherein the functional groups are selected from the group consisting of:
  (a) acrylates,

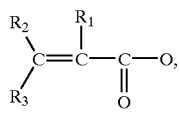

where $R_1$, $R_2$, and $R_3$ are selected from the group consisting of hydrogen and aliphatic groups, $C_nH_{2n+1}$ and $C_nH_{2n-1}$ (n=1 to 20);
  (b) carboxylic acid, —COOH;
  (c) epoxides,

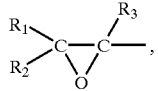

where $R_1$, $R_2$, and $R_3$ are selected from: hydrogen or aliphatic groups, $C_nH_{2n+1}$ and $C_nH_{2-1}$ (n=1 to 20); and
  (d) vinyls,

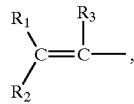

where $R_1$, $R_2$, and $R_3$ are selected from: hydrogen or aliphatic groups, $C_nH_{2n+1}$ and $C_nH_{2n-1}$ (n=1 to 20);
(C) 5 to 90 weight percent of a polymer binder; and
(D) 5 to 90 weight percent of metallic or oxide fillers, said metallic filler is selected from group consisting of Al, Ti, V, Cu, Mn, Fe, Co, Ni, Cu, Zn, Y, Zr, Nb, Mo, In, and Sb; said oxide filler is selected from the group consisting of Al, Ti, V, Cu, Mn, Fe, Co, Ni, Cu, Zn, Y, Zr, Nb, Mo, In, Sb, Ta, W, and Si.

This invention also discloses methods to use these compositions for microfabrication of ceramics, for stereolithography and as photoresists in x-ray, e-beam, and ion-beam lithography. Disclosed in this invention is a method of microfabricating ceramic or metal patterns on a solid substrate using ionization radiation comprising the steps of:
(i) mixing together a composition consisting essentially of a reactive monomer, a multi-functional cross-linking agent and filler; said mixing process optionally carried out either by heating the composition until melted or by dissolving components in a common solvent;
  optionally, in the presence of binder; and
  optionally, in the presence of a radiation sensitizer;
(ii) casting the composition on a solid substrate to form a film of desired thickness;
(iii) irradiating the film with ionization radiation through a mask to form a polymerized/cross-linked image;
(iv) developing the polymerized/cross-linked image by rinsing the irradiated film in a solvent to remove unirradiated composition; and
(v) sintering the polymerized/cross-linked image in microfabricated ceramics or metal patterns.

This invention also discloses a method of performing lithography on a semiconductor surface using ionization radiation, comprising the steps of:
(i) mixing a composition consisting essentially of a reactive monomer and a multi-functional cross-linking agent together, optionally by
  (a) heating the composition until melted; or
  (b) by dissolving in a common solvent;
    optionally, in the presence of a polymer binder; and
    optionally, in the presence of a radiation sensitizer;
(ii) casting the composition on a solid substrate to form a film of desired thickness;
(iii) irradiating the film with ionizing radiation through a mask to form a polymerized/cross-linked image; and
(iv) developing the polymerized/cross-linked image by rinsing the irradiated film in a solvent to remove unirradiated composition.

A further method disclosed in this invention is a method of forming a three-dimensional solid object of polymers, ceramics, or metals using ionization radiation, comprising the steps of:
(i) mixing together a composition consisting essentially of a reactive monomer, a multi-functional cross-linking agent, and a polymer binder, said mixing process optionally done by dissolving in a common solvent or by pouring the composition into a container with a target substrate immersed in it;
  optionally, in the presence of a radiation sensitizer; and
  optionally, in the presence of a metallic or oxide filler;
(ii) irradiating the composition with ionization radiation through a mask or a focused source of ionization radiation to deposit a layer of material on the targeted substrate;
(iii) stepping back the substrate and irradiating the substrate;
(iv) repeating the step of stepping back the substrate and irradiating the substrate until a desired three-dimensional solid object is formed; and
optionally, treating the solid object post-irradiation.

DETAILED DESCRIPTION OF THE DRAWINGS

FIG. 1 is a schematic illustration of a method of microfabrication of ceramics using ionization radiation imageable photopolymer compositions disclosed in this invention. The reference numbers provided here correspond to the reference numbers of FIG. 1. FIG. 1A shows ionization radiation imageable photopolymer composition, 1; and a substrate, 2. Arrow 3 represents exposure of the composition to ionization radiation imagingwise. FIG. 1B shows a mask, 5; unexposed region of imageable photopolymer composition (or unirradiated composition), 1; and cross-linked polymer/ceramics, 7, resulting from the ionization radiation exposure of the imageable photopolymer composition. FIG. 1C shows a representation of the removal of solvent to accomplish washing away the region of the substrate unexposed to the ionization radiation, 6, and cross-linked polymer/ceramics, 7. Arrow 8 represents the sintering step to bum out polymer binders. FIG. 1D shows the micofabricated ceramics, 9, and the substrate, 2.

FIG. 2 is a schematic illustration of a method of stereolithography using x-ray imageable photopolymer compositions to fabricate three-dimensional ceramics or metal objects. The reference numbers here correspond to the reference numbers of FIG. 2. FIG. 2A shows a representation of a substrate, 10, a x-ray imageable polymer/ceramics or polymer/metal compositions disclosed in this invention, 11, and a container, 12. Arrow 13 represents a first exposure of the composition to ionization radiation imagingwise. FIG. 2B shows a representation of cross-linked polymer/ceramic or polymer/metal, 14, after the first exposure to a scanning beam of ionization radiation, 15, such as x-ray or e-beam. Arrow 16 represents stepping back the substrate to allow for a second exposure of the composition to ionization radiation imagingwise. FIG. 2C represents cross-linked polymer/ceramic or polymer/metal, 17, after the second exposure to a scanning beam of ionization radiation, 15, such as x-ray or e-beam. Arrow 18 represents stepping back the substrate, 10, to allow for a third exposure of the composition to ionization radiation imagingwise. FIG. 2D is a representation of cross-linked polymer/ceramic or polymer/metal, 19, after the third exposure of the composition to ionization radiation imagingwise. Arrow 20 represents repetition of the stepping back and exposure steps until a desired shape/thickness is reached. FIG. 2E is a representation of an object formed by a method of this invention comprising cross-linked polymer/ceramic or polymer/metal. Arrow 22 represents an optional sintering step to bum out polymer binders. FIG. 2F is a representation of an object made of ceramics or metal in accordance with the method of this invention.

Figure 1A:
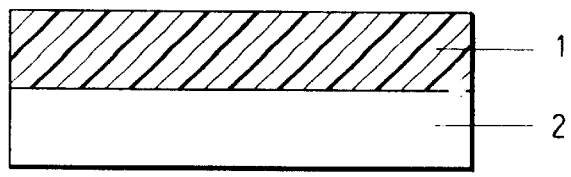
FIG. 1 is a schematic illustration of a method of microfabrication of ceramics using ionization radiation imageable photopolymer compositions.
Figure 1B:
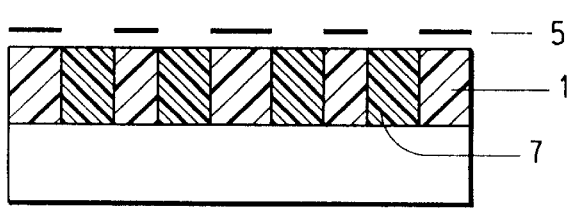
Figure 1C:
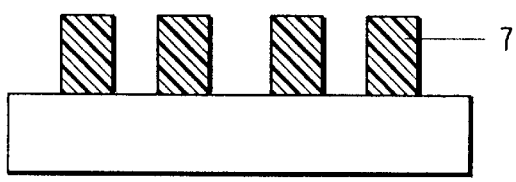
Figure 1D:
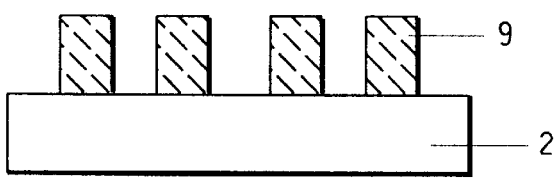
Figure 2A:
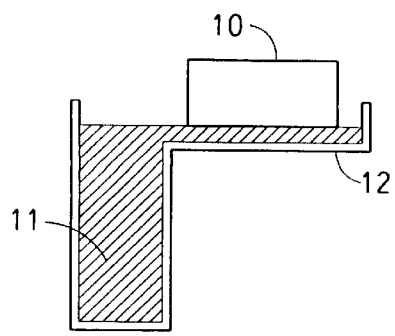
FIG. 2 is a schematic illustration of the method of stereolithography using x-ray imageable photopolymer compositions to fabricate three-dimensional ceramics or metal objects.
Figure 2B:
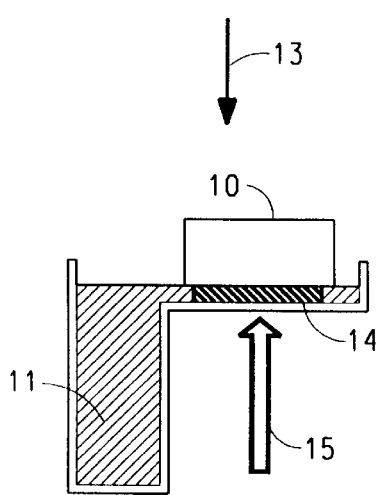
Figures 2C, 2D:
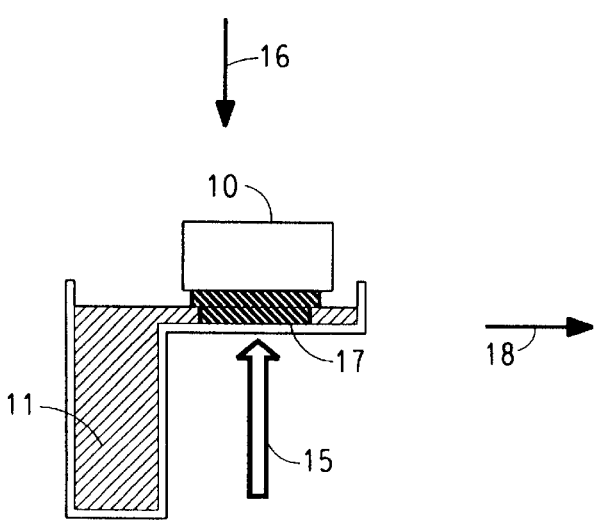
Figure 2F:
Figure 2E:
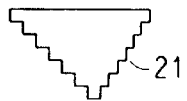
Figure 3A:
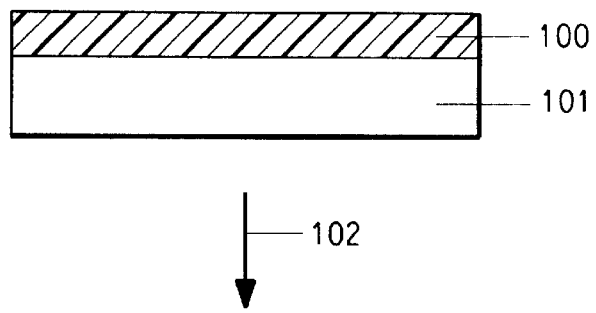
FIG. 3 is a schematic illustration of the method of x-ray lithography using x-ray imageable photopolymer compositions.
Figure 3B:
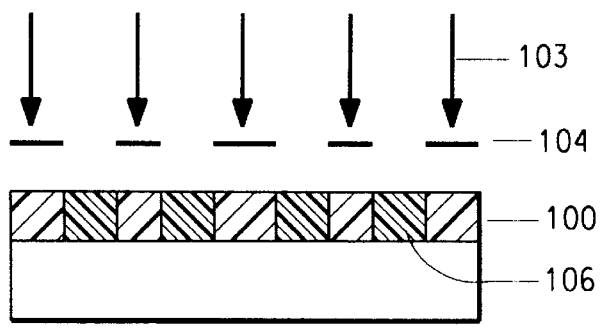
Figure 3C:
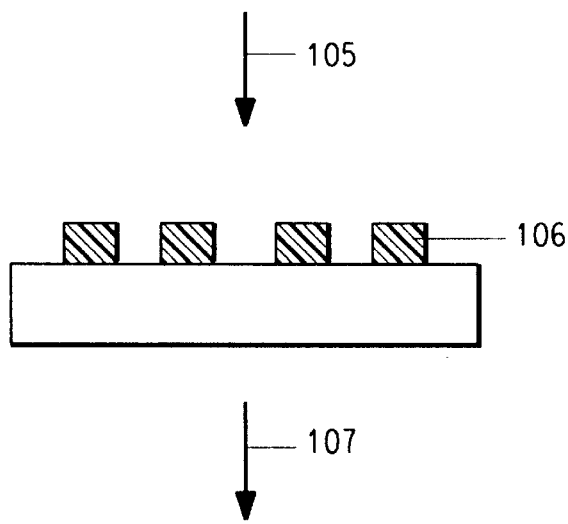

FIG. 3 is a schematic illustration of the method of x-ray lithography using x-ray imageable photopolymer compositions. E-beam can be used to replace x-ray. The numbers provided here correspond and refer to numbers shown in FIG. 3. FIG. 3A shows a representation of a x-ray imageble photopolymer composition, 100, disclosed in this invention and a substrate, 101, such as silicon wafer. Arrow 102 represents exposure of substrate to x-ray imagingwise. FIG. 3B shows x-ray beams, 103, and a x-ray mask, 104, unexposed regions of the x-ray imageble photopolymer composition, 100, and cross-linked polymers, 106. Arrow 105 represents the step of removing unexposed regions of the composition by washing with solvent. FIG. 3C represents cross-linked polymers, 106, and conventional wafer processing procedures, 107, such as etching or doping.

Figure 4:
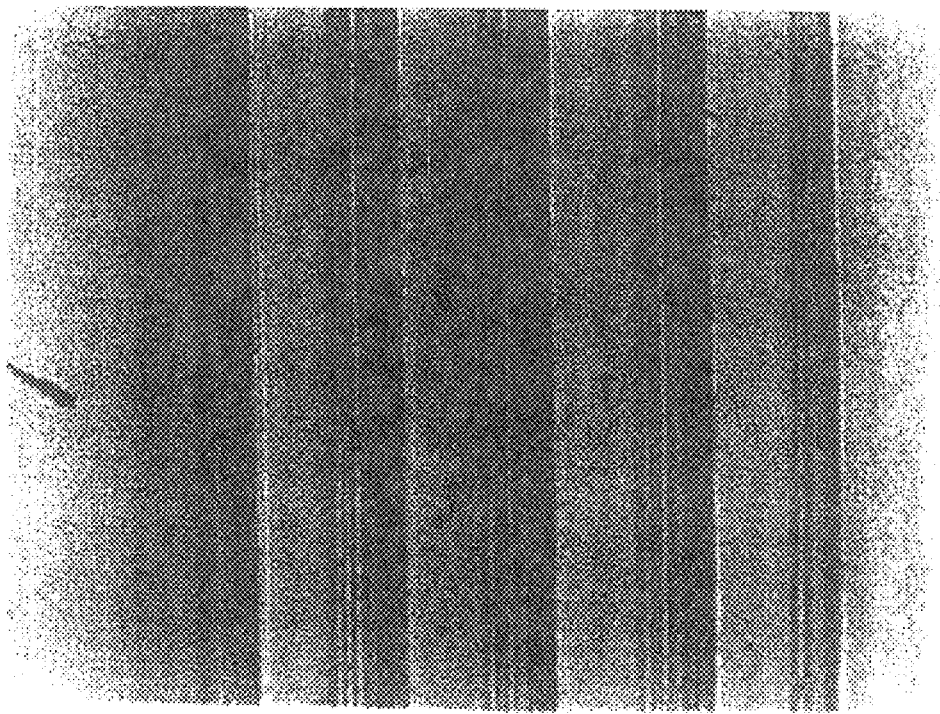
FIG. 4 is an optical micrograph of an image developed in accordance with Example 61 of the present application. The dark region represents the polymerized/cross-linked region, the width of which is about 140 microns.

FIG. 4 is an optical micrograph of an image developed in accordance with Example 61 of the present invention. The dark regions are the polymerized/cross-linked regions which has of width of about 140 microns.

DETAILED DESCRIPTION OF THE INVENTION

The compositions of this invention comprise five parts: (1) reactive monomer, (2) multi-functional cross-linking agent, (3) radiation sensitizer, (4) polymer binder, and (5) filler. The required components are the reactive monomer and the multi-functional cross-linking agent. Both have to be combined synergistically to form an effective composition. The absence of either one is not acceptable. The radiation sensitizer, polymer binder, and filler are required under some conditions and for certain applications. The effective composition has to show sufficient solubility change in a selected solvent after being irradiated by ionizing radiation such as x-ray, high-energy electron beam or gamma ray. This solubility change has to be confined only in the area that receives ionization radiation (that is, with good spatial resolution). For practical purposes, sufficient solubility change must be achieved with relatively low intensity radiation, such as those produced by a laboratory x-ray machine, rather than synchrotron radiation, which is more expensive. It should be achieved within a reasonably short duration preferably within about 1 hr or shorter.

To have a useful x-ray imageable photopolymer composition, many properties are required. The composition has to be able to polymerize/crosslink under relatively low intensity of x-ray beams such as those commonly used for x-ray diffraction, medical diagnostics and inspection. Some monomers/polymers (e.g., PMMA) can be polymerized/cross linked by high intensity synchrotron radiation but not under the irradiation of lower intensity laboratory x-ray machines. The exposure time required for polymerization/cross-linking should be as short as possible, preferably within an hour or less. The polymerized/cross-linked region should show large differentiation in solubility in certain solvents so the image can be developed by simply dissolving away the unexposed region. In order to retain the required spatial resolution, this differentiation in solubility between exposed and unexposed region has to be significant. In addition, the polymerization/cross-linking reaction has to be confined in the imaged area to maintain good spatial resolution.

The compositions should have thermal stability and long shelf life and preferably should b e h handling. For applications requiring the use of thin films, the composition should have the right properties, such as optimal viscosity, for the casting of good quality thin film. For applications involving the additions of fillers such as ceramics and metal particles, the composition has to be optimized to maintain the structural integrity after image development and sintering at high temperature.

One objective of this invention is to develop materials that can be polymerized/cross-linked imagewise by relatively low intensity ionization radiation, such as x-ray, e-beam or gamma ray, within a short duration. A further objective is to develop materials and technologies that are useful for microfabrication of ceramics, stereolithography, and x-ray (e-beam) lithography.

(A) Monomers:

Effective Monomers Have the Following General Structures:

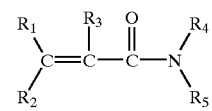

where $R_1$, $R_2$, $R_3$, $R_4$, and $R_5$ are selected from: hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, or aliphatic groups with R'O— substituent where R' represent aliphatic group, $C_nH_{2n+1}$ and $C_nH_{2n-1}$ (n=1 to 20).

Additional Effective Monomers Have the General Structures:

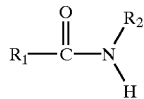

where $R_1$ and $R_2$ are selected from: hydrogen; aliphatic groups $C_nH_{2n+1}$ and $C_nH_{2n-1}$ (n=1 to 20); unsaturated aliphatic groups $C_nH_{2n-1}$ (n=1 to 20); or acetamide.

Additional Effective Monomers Have the General Structures:

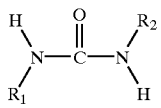

where $R_1$ and $R_2$ are selected: from: hydrogen; aliphatic groups $C_nH_{2n+1}$ and $C_nH_{2n-1}$ (n=1 to 20); or unsaturated aliphatic groups $C_nH_{2n-1}$ (n=1 to 20).

Additional Effective Monomers Have the General Structures:

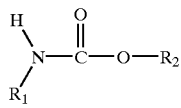

where $R_1$ and $R_2$ are selected from: hydrogen; aliphatic groups $C_nH_{2n+1}$ and $C_nH_{2n-1}$ (n=1 to 20); unsaturated aliphatic groups $C_nH_{2n-1}$ (n=1 to 20); or amino-substituted aliphatic groups, $C_nH_{2n+1}$ and $C_nH_{2-1}$ (n=1 to 20).

The Most Preferred Monomers are:

acrylamide

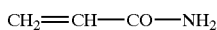

urea

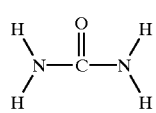

methylacrylamide

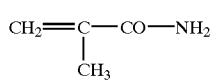

urethane

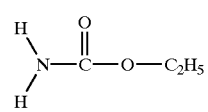

N-(t-butyl)acrylamide

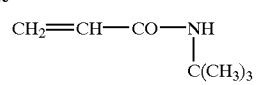

butylcarbamnate

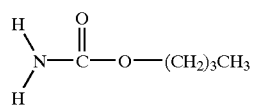

acetamide

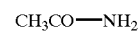

N,N'-methylenebisacrylamide

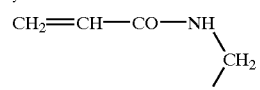

N-cyclohexylacrylamide

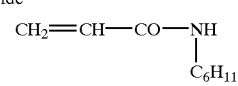

N-(3-aminopropyl)methacrylamide

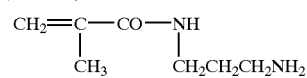

N-allylacrylamide

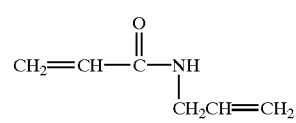

malonamide

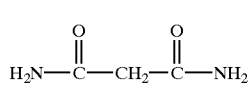

N-(iso-butoxymethyl)methylacrylamid

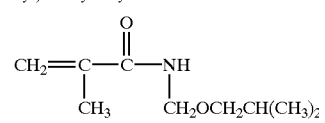

(B) Multi-functional Cross-linking Agents:

The effective cross-linking agents consist of a backbone (BB) connected with at least 2, preferably 2 to 4, most preferably 2 to 3 functional groups. This is shown schematically below:

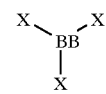

The choice of backbone affects the mechanical properties, the solubility properties, and the film coating properties of the composition. The preferred backbones are (1) linear or branched aliphatic chains, $—(CRH)_n—$, n=1000, where R represents an aliphatic group, $C_nH_{2n+1}$ and $C_nH_{2n-1}$ (n=1 to 20); (2) ethylene glycol chains, $—(CH_2CH_2O)_n—$ where n=1–1000; (3) propylene glycol chains, $—(CH(CH_3)CH_2O)_n—$ where n=1–1000; (4) saturated cyclic hydrocarbons such as cyclohexyl; and (5) isocyanurate, $C_3N_3O_3$, shown below.

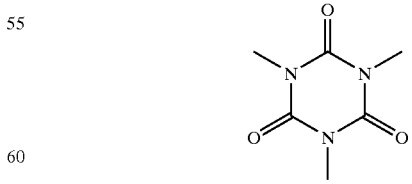

The choice of the functional group, X, determines the reactivity of the composition and the extent of polymerization/cross-linking in the irradiated product. The reactivity cannot be too high such that thermal polymerization occurs in the absence of x-ray. In general more than one functional group is needed for effective cross-linking and fast polymerization. A cross-linking agent may contain the same functional groups or different combinations of effective functional groups. Preferred functional groups are:

(1) acrylates, $$\begin{array}{c} R_2 \\ \phantom{R_2}\diagdown \\ \phantom{R_2}C=C-C-O, \\ R_3 \phantom{\diagup}\phantom{C}\phantom{=}\phantom{C}\phantom{-}\phantom{C}\|\\ \phantom{R_3}\phantom{\diagup}\phantom{C}\phantom{=}\phantom{C}\phantom{-}O \end{array}$$

where $R_1$, $R_2$, and $R_3$ are selected from hydrogen or aliphatic groups, $C_nH_{2n+1}$ and $C_nH_{2n-1}$ (n=1 to 20);

(2) carboxylic acid, —COOH;

(3) epoxides, $$\begin{array}{c} R_1 \diagdown \phantom{C} \diagup R_3 \\ \phantom{R_1}C\!-\!C \\ R_2 \diagup \phantom{C} \diagdown \\ \phantom{R_2 C}O \end{array},$$

where $R_1$, $R_2$, and $R_3$ are selected from: hydrogen or aliphatic groups, $C_nH_{2n+1}$ and $C_nH_{2-1}$ (n=1 to 20); and (4) vinyls, $$\begin{array}{c} R_1 \phantom{CC} R_3 \\ \phantom{R_1}\diagdown \phantom{C}\diagup \\ \phantom{R_1}C=C \\ R_2 \diagup \phantom{C}\diagdown \end{array},$$

where $R_1$, $R_2$, and $R_3$ are selected from: hydrogen or aliphatic groups, $C_nH_{2n+1}$ and $C_nH_{2n-1}$ (n=1 to 20).

The Most Preferred Cross-linking Agents are:

PEG(1000)dimethylacrylate $$CH_2\!=\!\underset{\underset{O}{\|}}{\overset{\overset{CH_3}{|}}{C}}\!-\!C\!-\!O\!-\!(CH_2CH_2O)_{M.W.1000}\!-\!\underset{\underset{O}{\|}}{C}\!-\!\overset{\overset{CH_3}{|}}{C}\!=\!CH_2$$

itaconic acid $$HOOC\!-\!CH_2\!-\!\underset{\phantom{|}}{\overset{\overset{CH_2}{\|}}{C}}\!-\!COOH$$

malonic acid $$HOOC\!-\!CH_2\!-\!COOH$$

polyacrylic acid $$(-CH_2CH-)_n\atop\phantom{xxxx}|\atop\phantom{xxxx}COOH$$

PEG(4000)diacrylate $$CH_2\!=\!CH\!-\!\underset{\underset{O}{\|}}{C}\!-\!O\!-\!(CH_2CH_2O)_{M.W.4000}\!-\!\underset{\underset{O}{\|}}{C}\!-\!CH\!=\!CH_2$$

1,4-cyclohexanediol dimethacrylate $$H_2C\!=\!\overset{\overset{H_3C}{|}}{C}\!-\!\underset{\underset{O}{\|}}{C}\!-\!O\!-\!\bigcirc\!-\!O\!-\!\underset{\underset{O}{\|}}{C}\!-\!\overset{\overset{CH_3}{|}}{C}\!=\!CH_2$$

PEG(600)diglycidyl ether $$CH_2\!-\!CHCH_2O\!-\!(CH_2CH_2O)_{M.W.600}\!-\!CH_2CH\!-\!CH_2\atop\diagdown\phantom{x}\diagup\phantom{xxxxxxxxxxxxxxxxxx}\diagdown\phantom{x}\diagup\atop O\phantom{xxxxxxxxxxxxxxxxxxxxxxxxxxxxx}O$$

allyl methacrylate $$H_2C\!=\!\overset{\overset{\phantom{O}}{|}}{\underset{\underset{CH_3}{|}}{C}}\!-\!\overset{\overset{O}{\|}}{C}\!-\!O\!-\!CH_2CH\!=\!CH_2$$

3-butene-1,2,3-tricaboxylic acid $$H_2C\!=\!\overset{\overset{\phantom{O}}{|}}{\underset{\underset{COOH}{|}}{C}}\!-\!\overset{\overset{COOH}{|}}{\underset{\phantom{|}}{CH}}\!-\!CH_2$$

triethylene glycol diacrylate $$H_2C\!=\!HC\!-\!\overset{\overset{O}{\|}}{C}\!-\!O\!-\!(CH_2CH_2O)_3\!-\!\overset{\overset{O}{\|}}{C}\!-\!CH\!=\!CH_2$$

1,1,1-trimethylolpropane trimethacylate $$(H_2C\!=\!\overset{\overset{\phantom{O}}{|}}{\underset{\underset{CH_3}{|}}{C}}\!-\!\overset{\overset{O}{\|}}{C}\!-\!O\!-\!CH_2)_3C\!-\!C_2H_5$$

methyl-2-isocyanato-3-methylbutyrate $$(CH_3)_2CHCH\overset{\overset{O}{\|}}{C}\!-\!O\!-\!CH_3\atop\phantom{xxxxx}|\atop\phantom{xxxxx}N\atop\phantom{xxxxx}\|\atop\phantom{xxxxx}C\atop\phantom{xxxxx}\|\atop\phantom{xxxxx}O$$

triallylisocyanurate tris(2-acryloxyethyl)isocyananurate tris(2,3-expoxypropyl)isocyananurate (triglycidyl isocyanurate)

(C) Radiation Sensitizers

The number of reactive species generated per unit volume for initiating polymerization reaction is low due to the low absorption cross-section of x-ray, e-beam, and gamma ray in organic media. The x-ray absorption efficiency of the composition may be improved by the addition of inorganics. If the particle size of the inorganics is too large, for example, in the microns size regime, the initially generated electrons and holes would recombine within the inorganic particle and disappear. Therefore, the inorganic particles have to be small enough, preferably in the nanometer-size regime, so that electrons and holes can escape to the surrounding media and initiate chemical reactions. The preparation of nanometer sized inorganic particles have been disclosed by U.S. Pat. No. 5,556,716 (Sep. 17, 1996, Herron and Wang); U.S. Pat. No. 5,132,051 (Jul. 21, 1992, Herron and Wang); U.S. 5,238,607 (Aug. 24, 1993, Herron and Wang), which are incorporated herein by reference; Res. Chem. Interm., 15, 17–29(1991), Y. Wang and N. Herron; J. Phys. Chem., 95, 525 (1991), Y. Wang and N. Herron.

The addition of inorganic radiation sensitizer enhances the x-ray absorption efficiency of the composition. It can also affect the polymerization/cross-linking kinetics, the overall reaction rate, and the cross-linking density of the irradiated region. Preferably, the inorganics should contain strong radiation-absorbing heavy atoms such as Bi, Pb, Hg, Au, Pt, and I and should be able to disperse easily into the composition, preferably in 0.1–80 wt. % range. Preferable, their size should be in the range of 1 nm to 1000 nm. The most preferred size range is 1 nm to 100 nm.

The inorganic nanoparticles are selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors. The preferred inorganic nanoparticles are selected from the group consisting of $Bi_2S_3$, $Bi_2Se_3$, $BiI_3$, $BiBr_3$, HgS, $PbI_2$, $PbI_4^{-2}$, and $Pb_2I_7^{-3}$. The most preferred inorganic nanoparticle is $BiI_3$.

(D) Binders:

The binder is defined here as a high molecular weight (>1000) polymer. The use of binders in the formulation serves many purposes. Certain monomers, such as acrylamide, have a tendency to crystallize, which not only reduces the x-ray sensitivity of the composition but also affects the spatial resolution of the x-ray imaged area. The addition of binders can prevent such monomer crystallization problem. Certain compositions of monomer and cross-linking agent, such as acrylamide and malonic acid, though polymerizable by x-ray irradiation, show uncontrolled polymerization and cannot retain the x-ray image. The addition of suitable binders can confine the polymerization in the irradiated region, thereby forming a useful x-ray image. The addition of binder can also enhance the film casting and handling properties which improves the ease of film preparation. Binders can also control the mechanical and chemical properties of the polymerized/cross-linked product.

The selection of binder depends on the composition of the monomer and the cross-linking agent used as well as the targeted application. The binder should be miscible with the monomer, the cross-linking agents, and, if used, the radiation sensitizer. For applications involving microfabrication of ceramics such as barrier rib fabrication for plasma display, the binder used should be burned out easily during the sintering step. Acrylate based polymer and polyethylene binders can be used for this purpose. When.the application is stereolithography, the mechanical strength and dimensional stability of the polymerized material are important. Acrylate and epoxy-based polymers as well as polyamides are effective binders for this application. When the application is lithography, the binder selected has to be stable under a plasma environment during the etching step in semiconductor manufacturing. Epoxy based polymers and polyamides are effective for this application. When aqueous based compositions are used, for example when environmental concerns are important, water-soluble polymers such as polyacrylamide, polyvinylalcohol, and polyethyleneglycol are suitable.

The preferred binders are acrylate polymers, acrylate-acrylic acid polymers such as CARBOSET xpd2470, available commercially from BF Goodrich Specialty Chemicals, Cleveland, Ohio, and related polymers), epoxy polymers, polyamides, polyacrylamides, polyvinylalcohol, poly(ethylene)glycol, poly(propylene)glycol, polyethylene, and polyvinylacetate.

(E) Fillers:

The compositions disclosed above can be mixed with ceramic particles or metal particles to form radiation sensitive composites. Using radiation (x-ray, electron beam, or gamma ray) imaging techniques, these compositions can then be fabricated into ceramic or metal objects after burning out the organics. The fillers used should not absorb radiation too strongly or they will reduce sensitivity. The surfaces of the fillers should not be reactive toward the monomers and cross-linking agents used in the compositions to avoid thermal polymerization. Suitable metal particle fillers consist of Al, Ti, V, Cu, Mn, Fe, Co, Ni, Cu, Zn, Y, Zr, Nb, Mo, In, and Sb. The preferred metal particle fillers are Al, Cu, Fe, Co, Ni, and Cu. The most preferred filler is Al. Suitable ceramic particle fillers consist of the oxides of Al, Ti, V, Cu, Mn, Fe, Co, Ni, Cu, Zn, Y, Zr, Nb, Mo, In, Sb, Ta, W, and Si. The preferred ceramic particle fillers are oxides of Al, Ti, Fe, Ni, Zn, Ta, W, and Si. The most preferred are aluminum oxides and silicon oxides.

(F) Preparation of Radiation-imageable Photopolymer Compositions:

The x-ray imageable compositions can be prepared by either the melt route or the solution route. Certain monomers, cross-linking agents, and radiation sensitizers, such as acrylamide, poly(ethyleneglycol)$_n$ dimethacrylate, and $BiI_3$, can be melted together. Solid thin film can then be formed by casting or extrusion from the melt. A more flexible method is to use a common solvent to dissolve all components together. For example, dimethylformamide is effective to dissolve acrylamide, poly(ethyleneglycol)$_n$ dimethacrylate, $BiI_3$, and CARBOSET xpd2470 binder together. This solution can be used directly for applications such as stereolithography; or solid films can be prepared from the solution by spin-coating or screen printing techniques.

(G) Radiation Sources:

The radiation source used in this invention is defined as ionization radiation, typically consisting of gamma ray, x-ray, electron beam, and ion beam. Gamma ray can be produced conveniently from radioactive isotopes such as $^{60}$Co. X-ray beam can be generated by electron bombardment of metal target or from synchrotron machine. Commonly used targets are W, Mo, and Cu. Electron beam can be generated by electron accelerator. Since the applications disclosed in this invention require radiation-induced polymerization to proceed with well-defined spatial resolution, a mask is usually required. When selecting the radiation source, the selection of mask material is an important consideration. The thickness of the mask material has to increase to compensate for the lower absorption efficiency with higher energy ionization radiation such as gamma ray. The preferred radiation sources are x-ray and electron beam. The most preferred source is x-ray.

(1) Microfabrication of ceramics: Microfabrication of ceramics are required for applications such as piezoelectrics and plasma display. Traditional microfabrication technique such as photolithography is not applicable because of the opaque nature of ceramic paste. The use of x-ray sensitive polymer/ceramic compositions can solve this problem. This is elaborated in the following for the fabrication of barrier ribs in plasma flat panel display.

In a typical plasma display device, special gas mixtures containing Xe or Ar are encapsulated in a cell, representing a pixel in a display device, with walls made of ceramics such as silica and alumina. The cell walls are coated with display phosphors with electrodes located at both ends. The application of a sufficiently large voltage across the electrodes breaks down the gases, which emit UV light, and excites the phosphors to produce the desired blue, green or red luminescence. The fabrication of the ceramic cell walls (or barrier ribs), with a typical dimension of 50–75 microns in width and 150–200 microns in height, is a challenge. The current preferred method involves repeated exposure of a very thin photopolymer/ceramic mixture film with photolithography to build up the thickness, layer by layer. This method is not acceptable for mass production because it is very slow and expensive. Use of the x-ray sensitive photopolymer/ceramic compositions disclosed in this invention allows a thicker layer to be formed with one-x-ray exposure. The basic principle is illustrated schematically in FIG. 1 below. The invention may be practiced in many different ways and is not limited to the configuration described here.

The feasibility of this application is exemplified in the Examples using x-ray sensitive compositions mixed with alumina and silica. The mixtures were polymerized/cross-linked imagewise by x-ray. The unexposed regions were easily washed out with solvents to reveal cross-linked solid images consisting of polymer/ceramic composite. This technology, as illustrated in FIG. 1, can be used to fabricate barrier ribs for plasma flat panel display.

(2) Stereolithography: There is a growing need for the rapid prototyping of three-dimensional (3D) objects from a computer aided design program. Such solid objects are needed for visualization, design modification, function checking, etc. Current technology consists of exposing a photopolymer composition using a scanning laser to form a cross-linked solid layer and then building up to a solid object layer by layer by stepping back the substrate as shown in FIG. 2. The photopolymer film has to be fairly thin with a typical thickness of 100–150 microns and the dimension of the finished object can be up to ½ meter. There is a market need for fabricating ceramic and metal objects which is difficult for the optical based photopolymer technology to deliver. The ionization radiation imageable photopolymer/ceramic and photopolymer/metal compositions disclosed of the present invention can address this problem. The basic principle is illustrated schematically in FIG. 2 below. The invention may be practiced in many different ways and is not limited to the configuration described here.

The feasibility of this application was demonstrated in the Examples given in this invention using x-ray sensitive compositions mixed with alumina, silica, or aluminum metal powders. The mixture was polymerized/cross-linked imagewise by x-ray. The unexposed region was easily washed out with solvents to reveal a cross-linked solid image consisting of polymer/ceramic composite or polymer/metal composite.

(3) X-ray lithography: X-ray lithography is being developed for the fabrication of a future generation of semiconductor devices with feature size as small as 30 nm (0.03 microns). Currently, there is no ideal photoresist for x-ray lithography. For example, PMMA thin film is used for this purpose but high intensity synchrotron radiation has to be used for writing an image (by ablation of the film). This is suitable for research purpose, but is not practical. The x-ray sensitive compositions disclosed in this invention can be used for this purpose. The working of a negative photoresist is illustrated schematically in FIG. 3. The invention may be practiced in many different ways and is not limited to the configuration described here.

Experimental Apparatus

The X-ray exposure experiments were performed using a Siemens x-ray generator equipped with a broad focus Mo-tube operating at 40 KV and 40 milliamp current. The incident x-ray dose rate was measured to be $6.1 \times 10^4$ roentgen/minute. By definition, the exposure of air to 1 roentgen(R) liberates a total electrical charge of $2.58 \times 10^{-4}$ coulombs per kilogram of air. When 1 cm$^3$ of air is given 1 roentgen of x-ray, the absorbed dose is 0.87 rad ("Radiation Chemistry", A. J. Swallow, Wiley, New York, 1973).

COMPARATIVE EXAMPLE A 3.496 g of acrylamide was melted at ~85° C. Films were casted with the melt on glass substrates. The films were irradiated by a x-ray beam from a Mo target for 10 and 30 minutes. The films were then developed by washing with water. The irradiated region showed a decrease in solubility but no insoluble image can be developed. This example demonstrates that compositions containing only reactive monomer such as acrylamide are not effective.

COMPARATIVE EXAMPLE B

A total of 4.543 g of acrylamide was added to 2.0 g of distilled water slowly over a period of 40 minutes and was stirred at room temperature overnight. The clear homogeneous solution was then diluted with 3.603 g of distilled water, making the concentration of acrylamide was 39.6%. Filled a glass vial (1.5 cm diameter) with some of the solution. The vial was irradiated by a x-ray beam from a Mo target for 30 minutes. The formation of an irregular shaped gel can be observed but no well-defined insoluble image can be obtained. This example demonstrates that although in aqueous solution the polymerization of acrylamide is enhanced compared to that in the solid state, the polymerization reaction cannot be controlled spatially and the polymerization product is not sufficiently insoluble, therefore is not useful for the applications considered in this invention.

COMPARATIVE EXAMPLE C 3.881 g of polyacrylamide/water solution (50/50) was irradiated in a glass vial by a x-ray beam from a Mo target for 30 minutes. There was no change in the solution after irradiation. This example demonstrates polyacrylamide alone is not effective.

EXAMPLE 1

2.503 g of acrylamide and 0.498 g of poly (ethyleneglycol)$_n$ dimethacrylate (PEGDMA), n=1000 in molecular weight, were mixed together and melted at ~85° C. 1.148 g of BiI$_3$ was added to the melt while stirring. The melt was casted onto a glass substrate to form a film. The film had orange-red color, rather than the black color characteristic of bulk BiI$_3$. This indicates the existence of nano-BiI$_3$. The film was irradiated by a x-ray beam from a Mo target for 1 hour. The film was then developed by washing with water. An insoluble spot was formed where the x-ray beam irradiated.

EXAMPLE 2

1.449 g of acrylamide and 1.001 g of PEGDMA were mixed together and melted at ~85° C. 1.001 g of BiI$_3$ was added to the melt while stirring. The melt was casted onto a glass substrate to form a film. The film was irradiated by a x-ray beam from a Mo target for 1 hour. The film was then developed by washing with water. An insoluble spot was formed at where the x-ray beam irradiated.

EXAMPLE 3

1.498 g of acrylamide and 0.996 g of PEGDMA were mixed together and melted at ~85° C. The melt was casted onto a glass substrate to form a film. The film was irradiated by a x-ray beam from a Mo target for 1 hour. The film was then developed by washing with water. An insoluble spot was formed at where the x-ray beam irradiated. Initially the spot was well defined spatially, but the spot swore when water was left on it for a few hours. This swelling was absent for compositions containing nano-$BiI_3$. This result indicates that after x-ray irradiation the cross-linking density is higher with compositions containing nano-$BiI_3$.

EXAMPLE 4

2.254 g of acrylamide and 1.54 g of PEGDMA were mixed together and melted at ~85° C. 0.417 g of $BiI_3$ was added to the melt while stirring. The melt was casted onto a glass substrate to form a film. The film was irradiated by a x-ray beam from a Mo target for 15 minutes. The film was then developed by washing with water. An insoluble spot was formed at where the x-ray beam irradiated.

EXAMPLE 5

3.009 g of acrylamide and 2.005 g of PEGDMA were mixed together and melted at ~85° C. 2.003 g of $BiI_3$ was added to the melt while stirring. 10.503 g of alumina was added to the mixture. The melt was casted onto a glass substrate to form a film. The film was irradiated by a x-ray beam from a Mo target for 1 hour. The film was then developed by washing with water. An insoluble spot was formed at where the x-ray beam irradiated.

EXAMPLE 6

0.761 g of acrylamide and 0.507 g of poly(ethyleneglycol)$_{M.W~4000}$ diacrylate were mixed together and melted at ~85° C. The melt was casted onto two separate glass substrates to form solid films. The films were irradiated by a x-ray beam from a Mo target for 15 minutes and 30 minutes, respectively. The films were then developed by washing with water. An insoluble spot was formed at where the x-ray beam irradiated.

EXAMPLE 7

1.54 g of acrylamide and 1.011 g of poly(ethyleneglycol)$_{M.W~600}$ diglycidyl ether were mixed together and melted at ~85° C. The melt was casted onto a glass substrate to form a film. The film was irradiated by a x-ray beam from a Mo target for 10 minutes. The film was then developed by washing with water. An insoluble spot was formed at where the x-ray beam irradiated.

EXAMPLE 8

2.998 g of acrylamide and 2.01 g of PEGDMA were mixed together and melted at ~85° C. 0.59 g of polyacrylamide (5–6 million molecular weight) was added to the melt while stirring. The melt was casted onto a glass substrate to form a film. The film was irradiated by a x-ray beam from a Mo target for 30 minutes. The film was then developed by washing with water. An insoluble spot was formed at where the x-ray beam irradiated.

EXAMPLE 9

2.515 g of acrylamide and 2.018 g of PEGDMA were mixed together and melted at ~85° C. 0.505 g of N-(3-aminopropyl)methacrylamide was added to the melt while stirring. The melt was casted onto a glass substrate to form a film. The film was irradiated by a x-ray beam from a Mo target for 10 minutes. The film was then developed by washing with water. An insoluble spot was formed at where the x-ray beam irradiated.

EXAMPLE 10

3.006 g of acrylamide and 2.009 g of PEGDMA were mixed together and melted at ~85° C. 3.013 g of alumina particles was added to the melt while stirring. The melt was casted onto a glass substrate to form a film. The film was irradiated by a x-ray beam from a Mo target for 1 hr. The film was then developed by washing with water. An insoluble spot was formed at where the x-ray beam irradiated.

EXAMPLE 11

3.011 g of N-(iso-butoxymethyl)methylacrylamide and 1.996 g of PEGDMA were mixed together and melted at ~85° C. The melt was casted onto a glass substrate to form a film. The film was irradiated by a x-ray beam from a Mo target for 1 hr. The film was then developed by washing with water. An insoluble spot was formed at where the x-ray beam irradiated.

EXAMPLE 12

2.996 g of acrylamide and 2.011 g of PEGDMA were mixed together and melted at ~85° C. 2.043 g of $BiI_3$ was added to the melt while stirring. 4.684 g of aluminum metal particles (20 microns) was then added to the mixture. The melt was casted onto a glass substrate to form a film. The film was irradiated by a x-ray beam from a Mo target for 30 min. The film was then developed by washing with water. An insoluble spot was formed at where the x-ray beam irradiated.

EXAMPLE 13

3.001 g of acrylamide and 1.997 g of PEGDMA were mixed together and melted at ~85° C. 3.336 g of aluminum metal particles (20 microns) was then added to the mixture. The melt was casted onto a glass substrate to form a film. The film was irradiated by a x-ray beam from a Mo target for 10 min. The film was then developed by washing with water. An insoluble spot was formed at where the x-ray beam irradiated.

EXAMPLE 14

3.0 g of methylacrylamide and 1.997 g of PEGDMA were mixed together and melted at ~110° C. The melt was poured into a 1.5 cm vial. The vial was irradiated by a x-ray beam from a Mo target for 10 min. The contents of the vial were then developed by washing with water. An insoluble plug was formed only at where the x-ray beam irradiated.

EXAMPLE 15

3.505 g of acetamide and 2.328 g of PEGDMA were mixed together and melted at ~85° C. The melt was poured into a 1.5 cm vial. The vial was irradiated by a x-ray beam from a Mo target for 30 min. The content of the vial was then developed by washing with water. An insoluble plug was formed at where the x-ray beam irradiated.

EXAMPLE 16

3.507 g of n-cyclohexylacrylamide and 2.336 g of PEGDMA were mixed together and melted at ~120° C. The melt was casted onto a glass substrate to form a film. The film was irradiated by a x-ray beam from a Mo target for 10 min. The film was then developed by washing with water. An insoluble spot was formed at where the x-ray beam irradiated.

EXAMPLE 17

3.008 g of acrylamide and 2.0 g of 3-butene-1,2,3-tricarboxylic acid were mixed together and melted at ~135° C. The melt was poured into a 1.5 cm vial. The vial was irradiated by a x-ray beam from a Mo target for 10 min. The content of the vial was then developed by washing with water. An insoluble plug was formed at where the x-ray beam irradiated.

EXAMPLE 18

3.003 g of acrylamide and 2.009 g of PEGDMA were mixed together and melted at ~85° C. 0.063 g of polyethylene was then added to the mixture. The melt was casted onto a glass substrate to form a film. The film was irradiated by a x-ray beam from a Mo target for 10 min. The film was then developed by washing with water. An insoluble spot was formed at where the x-ray beam irradiated.

EXAMPLE 19

3.01 g of acrylamide and 2.014 g of PEGDMA were mixed together and melted at ~85° C. 0.267 g of malonic acid was then added to the mixture. The melt was casted onto a glass substrate to form a film. The film was irradiated by a x-ray beam from a Mo target for 2.5 min. The film was then developed by washing with water. An insoluble spot was formed at where the x-ray beam irradiated.

EXAMPLE 20

3.004 g of acrylamide and 2.006 g of PEGDMA were mixed together and melted at ~85° C. 0.477 g of poly(propyleneoxide)cyclocarbonate terminated was then added to the mixture. The melt was casted onto a glass substrate to form a film. The film was irradiated by a x-ray beam from a Mo target for 10 min. The film was then developed by washing with water. An insoluble spot was formed at where the x-ray beam irradiated.

EXAMPLE 21

3.003 g of n-cyclohexylacrylamide and 2.002 g of PEGDMA were mixed together and melted at ~118° C. The melt was casted onto two separate glass substrates to form films. The films were irradiated by a x-ray beam from a Mo target for 10 and 30 minutes. The substrates were developed by washing with water. An insoluble spot was formed where the x-ray beam irradiated in both cases.

EXAMPLE 22

A mixture was prepared consisting of 3.008 g of acrylamide, 1.998 g of PEGDMA and 5 mls of DMF. 2.998 g of Carboset XPD2470 polymer binder was added to 6.711 g of the mixture prepared above and was stirred at room temperature for 70 hours (no heat was required). Films were casted onto two separate glass substrates, and a glass vial (1.5 cm diameter) sample was prepared. The films were irradiated by a x-ray beam from a Mo target for 10 and 30 minutes, respectively, both giving positive results. An insoluble spot was formed where the x-ray beam irradiated. The vial sample was irradiated for 30 minutes and a solid white plug, a replica of the x-ray beam, was formed.

EXAMPLE 23

Added 3.000 g of acrylamide and 2.009 g of PEGDMA to a mixture of 0.509 g of Carboset XPD2470 and 5 mls of DMF. The mixture was stirred at RT for 1 hour. Two glass vials were filled with the solution and irradiated by a x-ray beam from a Mo target for 30 and 60 minutes and a solid white plug, a replica of the x-ray beam, was formed in both cases.

EXAMPLE 24

0.998 g of Carboset XPD2470 and 5 mls of DMF were mixed together and stirred at RT for 1 hour. 3.008 g of acrylamide and 2.000 g of PEGDMA were then added and the mixture was stirred at RT for 3 hours. A 1.5 cm diameter glass vial was filled with some of the solution and a film was casted on a glass substrate. Both were irradiated by a x-ray beam from a Mo target for 30 minutes. A solid white plug, a replica of the x-ray beam, was formed in the vial sample, while the film sample gave an insoluble spot where the x-ray beam irradiated after developed with acetone.

EXAMPLE 25

Example 27 was repeated as described above but with the following amounts: 5 mls DMF, 2.005 g XPD2470, 3.008 g acrylamide and 2.008 g PEGDMA. Both the vial and film samples gave positive results as described in Example 27.

EXAMPLE 26

Prepared a mixture of 2.500 g Carboset XPD2470, 10 mls DMF, 5.997 g acrylamide and 3.992 g PEGDMA and stirred at room temperature for ~1.5 hours. 0.330 g of $BiI_3$ and 2.998 g of the above mixture were mixed together and stirred at room temperature for 20 minutes. Films were casted on glass substrates and irradiated by a x-ray beam from a Mo target for 10 and 30 minutes. Both gave positive results once developed with acetone. An insoluble spot was formed where the x-ray beam irradiated.

EXAMPLE 27

Prepared a mixture of 2.500 g Carboset XPD2470, 10 mls DMF, 5.997 g acrylamide and 3.992 g PEGDMA and stirred at room temperature for ~1.5 hour. 1.930 g of silica glass particles (70.9% $SiO_2$, 11.6% CaO, 8.7% $Na_2O$, 7.7% $K_{2O}$, 1.1% $Sb_2O_3$) and 3.011 g of the above mixture were mixed together and stirred at room temperature for 20 minutes. Films were casted on glass substrates and irradiated by a x-ray beam from a Mo target for 10 and 30 minutes. Both gave positive results once developed with acetone. An insoluble spot was formed where the x-ray beam irradiated.

EXAMPLE 28

Prepared a mixture of 2.500 g Carboset XPD2470, 10 mls DMF, 5.997 g acrylamide and 3.992 g PEGDMA and stirred at room temperature for ~1.5 hour. 1.938 g of silica glass particles (71% $SiO_2$, 26% $B_2O_3$, 0.5% $Na_2O$, 1% $K_2O$, 1% $Al_2O_3$, 0.5% LiO) and 3.011 g of the above mixture were and 3.006 g of the above mixture were mixed together and stirred at room temperature for 20 minutes. Films were casted on glass substrates and irradiated by a x-ray beam from a Mo target for 10 and 30 minutes. Both gave positive results once developed with acetone. An insoluble spot was formed where the x-ray beam irradiated.

EXAMPLE 29

Prepared a mixture of 2.500 g Carboset XPD2470, 10 mls DMF, 5.997 g acrylamide and 3.992 g PEGDMA and stirred at room temperature for ~1.5 hour. 0.321 g of polyvinyl alcohol and 3.008 g of the above mixture were mixed together and stirred at room temperature for 3 hours. Films were casted on glass substrates. The films were irradiated by a x-ray beam from a Mo target for 10 and 30 minutes. Both film samples gave positive results once developed with acetone. An insoluble spot was formed where the x-ray beam irradiated.

COMPARATIVE EXAMPLE D 5.812 g of acrylamide and 5.811 g of malonic acid was mixed together and heated at 85° C. to form a viscous liquid. A glass vial (1.5 cm diameter) was filled with some of the melt. The vial was irradiated by a x-ray beam from a Mo target for 15 minutes. The entire contents of the vial was polymerized to form an opaque, gel-like polymer without well-defined spatial pattern of the x-ray beam.

EXAMPLE 30

3.01 g of acrylamide and 2.0 g of malonic acid were mixed together with a solution of 1.252 g of Carboset XPD2470 and 5 mls of DMF and heated to 95° C. Films were cast onto two separate glass substrates, and a glass vial was filled with some of the solution. The films were irradiated by a x-ray beam from a Mo target for 10 and 30 minutes, respectively. The vial was irradiated for 30 minutes. Both film samples gave positive results once developed with acetone. An insoluble spot was formed where the x-ray beam irradiated. A solid white plug, a replica of the x-ray beam, was formed in the vial sample.

EXAMPLE 31

3.004 g of acrylamide, 2.009 g of PEGDMA and 5 mls of DMF were mixed together and heated to ~60° C. A total of 1.251 g of polyethylene glycol was added over ~30 minutes. Films were casted from the viscous melt on glass substrates. The films were irradiated by a x-ray beam from a Mo target for 10 and 30 minutes. Both gave positive results once developed with acetone. An insoluble spot was formed where the x-ray beam irradiated.

A stock solution of 62.501 g of Carboset XPD2470 and 250 mls of DMF was made and used in the preparation of Examples 36 to 48:

EXAMPLE 32

5.971 g of the stock Carboset XPD2470/DMF solution, 2.500 g of acrylamide and 2.518 g of trimethylolpropane triethoxy triacrylate (TMPEOTA) were mixed together and heated to ~85° C. Films were casted on glass substrates. The films were irradiated by a x-ray beam from a Mo target for 10 and 30 minutes. Both gave positive results once developed with acetone. An insoluble spot was formed where the x-ray beam irradiated.

EXAMPLE 33

5.980 g of the stock Carboset XPD2470/DMF solution, 2.498 g of acrylamide and 2.498 g of itaconic acid were mixed together and heated at ~130° C. Films were casted onto two glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 34

5.977 g of the Carboset XPD2470/DMF solution, 3.031 g of polyacrylic acid (90,000 MW) and 2.506 g of acrylamide were mixed together and heated to ~120° C. Films were casted onto two glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 35

5.990 g of the Carboset XPD2470/DMF solution, 2.497 g of acrylamide and 2.503 g of 1,6-cyclohexandiol dimethylacrylate were mixed together and heated at ~75° C. Films were casted on glass substrates. The films were irradiated by a x-ray beam from a Mo target for 10 and 30 minutes. Both gave positive results once developed with acetone. An insoluble spot was formed where the x-ray beam irradiated.

EXAMPLE 36

5.985 g of the Carboset XPD2470/DMF solution, 2.501 g of acrylamide and 2.510 g of allyl methacrylate were mixed together and heated to ~85° C. Films were casted onto two separate glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 37

5.988 g of the Carboset XPD2470/DMF solution, 2.503 g of acrylamide and 2.505 g of methyl-2-isocyanato-3-methylbutylrate were mixed together and heated to ~98° C. Films were casted onto two separate glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 38

5.980 g of the Carboset XPD2470/DMF solution, 2.500 g of acrylamide and 2.518 g of triallyl isocyanurate were mixed together and melted at ~95° C. Films were casted on glass substrates. The films were irradiated by a x-ray beam from a Mo target for 10 and 30 minutes. Both gave positive results once developed with acetone. An insoluble spot was formed where the x-ray beam irradiated.

EXAMPLE 39

5.974 g of the Carboset XPD2470/DMF solution, 2.498 g of acrylamide and 2.503 g of triglycidal isocyanurate were mixed together and heated to ~140° C. Films were casted onto two separate glass substrates. The films were irradiated by a x-ray beam from a Mo target for 10 and 30 minutes.

Both gave positive results once developed with acetone. An insoluble spot was formed where the x-ray beam irradiated.

EXAMPLE 40

5.984 g of the Carboset XPD2470/DMF solution, 2.510 g of acrylamide and 2.509 g of tris(2-acryloxyethyl) isocyanurate were mixed together and heated to ~100° C. Films were casted onto two glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 41

2.394 g of the Carboset XPD2470/DMF solution, 0.998 g of PEGDMA and 0.998 g of urea were mixed together and heated to ~131° C. Films were casted onto two separate glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 42

2.394 g of the Carboset XPD2470/DMF solution, 0.996 g of PEGDMA and 1.004 g of urethane were mixed together and heated to ~85° C. Films were casted onto two separate glass substrates. The films were irradiated by a x-ray beam from a Mo target for 10 and 30 minutes, respectively. Both gave positive results once developed with acetone. An insoluble spot was formed where the x-ray beam irradiated.

EXAMPLE 43

2.386 g of the Carboset XPD2470/DMF solution, 1.000 g of PEGDMA and 0.997 g of butylcarbamate were mixed together and heated to ~85° C. Films were casted on glass substrates. The films were irradiated by a x-ray beam from a Mo target for 10 and 30 minutes. Both gave positive results once developed with acetone. An insoluble spot was formed where the x-ray beam irradiated.

EXAMPLE 44

5.298 g of the Carboset XPD2470/DMF solution, 2.646 g of acrylamide and 1.775 g of PEGDMA were mixed together and stirred at room temperature for 2 hours, then 6.203 g of silica glass particles (71% $SiO_2$, 26% $B_2O_3$, 0.5% $Na_2O$, 1% $K_2O$, 1% $Al_2O_3$, 0.5% LiO) was added and the mixture was stirred for ~30 minutes. Three films were casted onto separate glass substrates from the mixture using a 30 mil doctor knife. After air drying the first film for 1.5 hours, second and third layers were casted and air dried overnight. The films were irradiated by a x-ray beam from a Mo target for 10, 20 and 30 minutes. All gave positive results once developed with acetone. An insoluble spot was formed where the x-ray beam irradiated.

EXAMPLE 45

2.995 g of acrylamide was melted at ~85° C. Then 0.745 g of $BiI_3$ was added to the clear melt and the.resulting orange-brown mixture was stirred for 5 minutes. The melt was casted onto two glass substrates to form films. The films were irradiated with a x-ray beam from a Mo target for 10 and 30 minutes, respectively. The films were then developed by washing with acetone. Insoluble spots were formed where the x-ray beam irradiated.

COMPARATIVE EXAMPLE E 1.436 g of Poly(acrylic acid) was loaded into a 1.5 cm glass vial. The sample was irradiated by a x-ray beam from Mo target for 1 hour. No insoluble product was formed and no image was developed. This example demonstrates that poly(acrylic acid) alone is not effective.

EXAMPLE 46

2.395 g of acrylamide, 1.618 g of acrylic acid and 5.010 g of Carboset XPD2470/DMF solution (20% solids) were mixed together and heated to ~85° C. A vial of 1.5 cm diameter was filled with the mixture. The vial was irradiated by a x-ray beam from a Mo target for 60 minutes. The contents of the vial were developed by washing with acetone. A solid white plug, a replica of the x-ray beam, was formed in the vial sample.

EXAMPLE 47

3.002 g of acrylamide and 2.999 g of poly(acrylic acid) were mixed together and melted at ~85° C. A vial (1.5 cm diameter) was filled with the melt. The vial was irradiated by a x-ray beam from a Mo target for 60 minutes. The contents of the vial were developed by washing with acetone. A solid white plug, a replica of the x-ray beam, was formed in the vial sample.

EXAMPLE 48

2.509 g of Carboset XPD2470/DMF solution (20 wt. % solids), 1.208 g of N-(iso-butoxy-methyl)acrylamide and 0.807 g of PEGDMA were mixed together and heated to ~100° C. A glass vial was filled with the mixtures. The vial was irradiated by a x-ray beam from a Mo target for 30 minutes. The irradiated vial was washed with acetone. A solid white plug, a replica of the x-ray beam, was formed in the vial sample.

EXAMPLE 49

2.501 g of Carboset XPD2470/DMF solution (20 wt. % solids), 1.201 g of acrylamide and 0.803 g of 1,4-butanedioldimethacrylate were mixed together and heated to ~80° C. Filled a glass vial with the mixtures. The vial was irradiated by a x-ray beam from a Mo target for 30 minutes. The irradiated vial was washed with acetone. A solid white plug, a replica of the x-ray beam, was formed in the vial sample.

EXAMPLE 50

2.512 g of Carboset XPD2470/DMF solution (20% solids), 1.201 g acrylamide and 0.803 g of poly(propylene glycol)$_{M.W.~300}$ monoethacrylate were mixed together and heated to ~80° C. Filled a glass vial with the mixtures. The vial was irradiated by a x-ray beam from a Mo target for 30 minutes. The irradiated vial was washed with acetone. A clear soft plug, a replica of the x-ray beam, was formed in the vial sample.

EXAMPLE 51

2.506 g of Carboset XPD2470/DMF solution (20 wt. % solids), 1.202 g of acrylamide and 0.820 g of poly (propyleneoxide)cyclocarbonate terminated were mixed together and heated to ~80° C. A glass vial was filled with the mixtures. The vial was irradiated by a x-ray beam from a Mo target for 30 minutes. The irradiated vial was washed with acetone. A solid white plug, a replica of the x-ray beam, was formed in the vial sample.

EXAMPLE 52

2.504 g of Carboset XPD2470/DMF solution (20 wt. % solids), 1.199 g of acrylamide and 0.820 g of poly (propyleneoxide) epoxy were mixed together and heated at ~120° C. A glass vial was filled with the mixtures. The vial was irradiated by a x-ray beam from a Mo target for 30 minutes. The irradiated vial was washed with acetone. A solid white plug, a replica of the x-ray beam, was formed in the vial sample.

EXAMPLE 53

2.508 g of Carboset XPD2470/DMF solution (20 wt. % solids), 1.202 g of acrylamide and 0.813 g of triethylene glycol diacrylate were mixed together and heated to ~80° C. A glass vial was filled with the mixtures. The vial was irradiated by a x-ray beam from a Mo target for 30 minutes. The irradiated vial was washed with acetone. A solid white plug, a replica of the x-ray beam, was formed in the vial sample.

EXAMPLE 54

2.520 g of Carboset XPD2470/DMF solution (20 wt. % solids), 1.197 g of acrylamide and 0.811 g of triglycidal isocyanurate were mixed together and heated at ~120° C. A glass vial was filled with the mixtures. The vial was irradiated by a x-ray beam from a Mo target for 30 minutes. The irradiated vial was washed with acetone. A solid white plug, a replica of the x-ray beam, was formed in the vial sample.

EXAMPLE 55

5.977 g of Carboset XPD2470/DMF (20 wt. %) solution, 2.502 g of acrylamide and 2.513 g of triethylene glycol diacrylate were mixed together and heated to ~100° C., at which time a clear homogeneous solution was formed. A glass vial was filled with some of the solution. The vial was irradiated by a x-ray beam from a Mo target for 30 minutes. A solid white material was formed. Rinsed with acetone to develop.

EXAMPLE 56

5.974 g of Carboset XPD2470/DMF (20 wt. %) solution, 2.509 g of acrylamide and 2.511 g of tri-glycidyl isocyanurate were mixed together and heated to ~155° C., at which time a thick cloudy solution was formed. A glass vial was filled with some of the solution. The vial was irradiated by a x-ray beam from a Mo target for 30 minutes. A solid white plug was observed. Rinsed with acetone to develop.

EXAMPLE 57

2.499 g of Carboset XPD2470/DMF (20 wt. %) solution, 1.199 g of n-allyl acrylamide and 0.799 g of PEGDMA were mixed together and heated to ~105° C., at which time the mixture was a cloudy tea-colored and full of tiny bubbles. A glass vial was filled with some of the solution. The vial was irradiated by a x-ray beam from a Mo target for 60 minutes. The contents of the vial were rinsed with acetone to develop. A small tea-colored mass was formed on the wall of the vial.

EXAMPLE 58

2.502 g of Carboset XPD2470/DMF (20 wt. %) solution, 1.202 g of n-(iso-butoxymethyl)methyl-acrylamide and 0.807 g of PEGDMA were mixed together and heated to ~95° C., at which time the mixture was clear and homogeneous. A glass vial was filled with some of the solution. The vial was irradiated by a x-ray beam from a Mo target for 60 minutes and developed with acetone. A clear gel that spanned halfway across the diameter of the vial was formed.

EXAMPLE 59

2.497 g of Carboset XPD2470/DMF (20 wt. %) solution, 1.204 g of malonamide and 0.806 g of PEGDMA were mixed together and heated to ~175° C., at which time the mixture was cloudy and white with no sign of insolubles. A glass vial was filled with some of the solution. The vial was irradiated by a x-ray beam from a Mo target for 60 minutes and developed with acetone. A white plug which spanned halfway across the diameter of the vial was formed.

EXAMPLE 60

Added to 5.018 g of poly(vinylacetate)/DMF solution (20 wt. % solids), 2.408 g of acrylamide and 1.604 g of PEGDMA. The mixture was stirred at room temperature for ~1.5 hours, after which time the mixture was clear, homogeneous, and very viscous. Two microscope slides were coated with the solution. Two glass vials were also filled with some of the solution. The vials were irradiated immediately by a x-ray beam from a Mo target for 10 and 30 minutes, respectively, and then developed with acetone. A small white mass was formed on the wall of the vial that was irradiated for 10 minutes while a white plug was formed across the diameter of the 30 minute vial. The slides were air dried at room temperature overnight then irradiated under the same conditions as the vials for 10 and 30 minutes. Developed with acetone and observed positive results in both cases as insoluble dots formed.

EXAMPLE 61

Added to 2.518 g of XPD2470/DMF solution (20 wt. % solids), 1.015 g of acrylamide and 1.001 g of PEGDMA. The mixture was heated to ~85° C., at which time the mixture became clear and homogeneous. Several microscope slides were coated with the solution and air dried at room temperature overnight. A slide was irradiated using the 2 and 4 LP/mm area of a Pb mask with a x-ray beam from a Mo target for 8 minutes, and developed with acetone. Insoluble line patterns, corresponding to the image of the Pb mask, were formed on the slide after developing. Micrograph from a 4 LP/mm mask is shown in FIG. 4 where the line width is about 140 microns.

What is claimed is:

1. A light stable composition, that can be polymerized/ cross-linked imagewise by ionizing radiation, consisting essentially of:

(A) from 10 to 90 weight percent of a reactive monomer having at least one amide functional group, said monomer selected from the group consisting of:

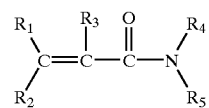

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

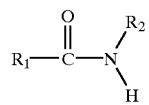

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and acetamide;

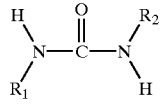

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

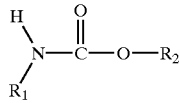

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone having at least 2 functional groups, said backbone is selected from the group consisting of:
(1) linear or branched aliphatic chains, —(CRH)$_n$—, n=1–1000, where R represents an aliphatic group, $C_nH_{2n+1}$ and $C_nH_{2n-1}$ (n=1 to 20);
(2) ethylene glycol chains, —CH$_2$CH$_2$O)$_n$— where n=1–1000;
(3) propylene glycol chains, —CH(CH$_3$)CH$_2$O)$_n$— where n=1–1000;
(4) cyclohexyl; and
(5) isocyanurate, $C_3N_3O_3$; and
wherein the functional groups are selected from the group consisting of:
(a) acrylates,

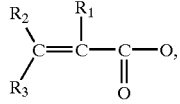

where $R_1$, $R_2$, and $R_3$ are selected from the group consisting of hydrogen and aliphatic groups, $C_nH_{2n+1}$ and $C_nH_{2-1}$ (n=1 to 20);
(b) carboxylic acid, —COOH;
(c) epoxides,

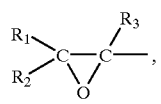

where $R_1$, $R_2$, and $R_3$ are selected from: hydrogen or aliphatic groups, $C_nH_{2n+1}$ and $C_nH_{2n-1}$ (n=1 to 20); and (d) vinyls,

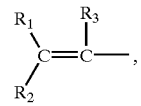

where $R_1$, $R_2$, and $R_3$ are selected from: hydrogen or aliphatic groups, $C_nH_{2n+1}$ and $C_nH_{2n-1}$ (n=1 to 20); and (C) from 0.1 to 80 weight percent of an inorganic radiation sensitizer having a particle size in the range of 1 nanometer to 1000 nanometers, said radiation sensitizer is selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors.

2. A light stable composition, that can be polymerized/cross-linked imagewise by ionizing radiation, consisting essentially of:
(A) from 10 to 90 weight percent of a reactive monomer having at least one amide functional group, said monomer selected from the group consisting of:

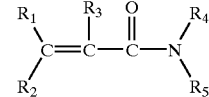

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

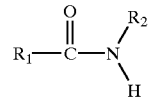

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2-1}$ (n=1 to 20); and acetamide;

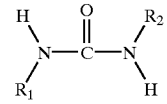

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

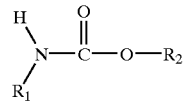

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone having at least 2 functional groups, said backbone is selected from the group consisting of:
(1) linear or branched aliphatic chains, —(CRH)$_n$—, n=1–1000, where R represents an aliphatic group, $C_nH_{2n+1}$ and $C_nH_{2n-1}$ (n=1 to 20);
(2) ethylene glycol chains, —(CH$_2$CH$_2$O)$_n$— where n=1–1000;
(3) propylene glycol chains, —(CH(CH$_3$)CH$_2$O)$_n$— where n=1–1000;
(4) cyclohexyl; and
(5) isocyanurate, C$_3$N$_3$O$_3$; and
wherein the functional groups are selected from the group consisting of:
(a) acrylates,

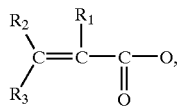

where R$_1$, R$_2$, and R$_3$ are selected from the group consisting of hydrogen and aliphatic groups, $C_nH_{2n+1}$ and $C_nH_{2n-1}$ (n=1 to 20);
(b) carboxylic acid, —COOH;
(c) epoxides,

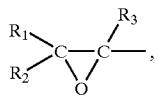

where R$_1$, R$_2$, and R$_3$ are selected from: hydrogen or aliphatic groups, $C_nH_{2n+1}$ and $C_nH_{2n-1}$ (n=1 to 20); and
(d) vinyls,

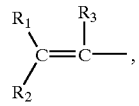

where R$_1$, R$_2$, and R$_3$ are selected from: hydrogen or aliphatic groups, $C_nH_{2n+1}$ and $C_nH_{2n-1}$ (n=1 to 20);
(C) from 0.1 to 80 weight percent of an inorganic radiation sensitizer having a particle size in the range of 1 nanometer to 1000 nanometers, said radiation sensitizer is selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors; and
(D) 5 to 90 weight percent of a polymer binder.

3. A light stable composition, that can be polymerized/cross-linked imagewise by ionizing radiation, consisting essentially of:
(A) from 10 to 90 weight percent of a reactive monomer having at least one amide functional group, said monomer selected from the group consisting of:

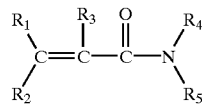

where R$_1$, R$_2$, R$_3$, R$_4$, and R$_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

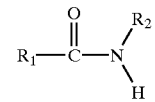

where R$_1$ and R$_2$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); and acetamide;

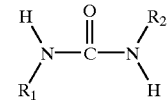

where R$_1$ and R$_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

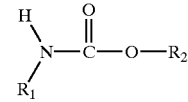

where R$_1$ and R$_2$ are selected from the group consisting of: hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone having at least 2 functional groups, said backbone is selected from the group consisting of:
(1) linear or branched aliphatic chains, —(CRH)$_n$—, n=1–1000, where R represents an aliphatic group, $C_nH_{2n+1}$ and $C_nH_{2n-1}$ (n=1 to 20);
(2) ethylene glycol chains, —(CH$_2$CH$_2$O)$_n$— where n=1–1000;
(3) propylene glycol chains, —(CH(CH$_3$)CH$_2$O)$_n$— where n=1–1000;
(4) cyclohexyl; and
(5) isocyanurate, C$_3$N$_3$O$_3$; and
wherein the functional groups are selected from the group consisting of:
(a) acrylates,

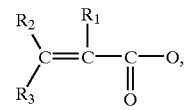

where R$_1$, R$_2$, and R$_3$ are selected from the group consisting of hydrogen and aliphatic groups, $C_nH_{2n+1}$ and $C_nH_{2n-1}$ (n=1 to 20);

(b) carboxylic acid, —COOH;
(c) epoxides,

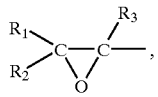

where $R_1$, $R_2$, and $R_3$ are selected from: hydrogen or aliphatic groups, $C_nH_{2n+1}$ and $C_nH_{2n-1}$ (n=1 to 20); and (d) vinyls,

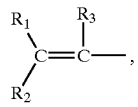

where $R_1$, $R_2$, and $R_3$ are selected from: hydrogen or aliphatic groups, $C_nH_{2n+1}$ and $C_nH_{2-1}$ (n=1 to 20);

(C) from 0.1 to 80 weight percent of an inorganic radiation sensitizer having a particle size in the range of 1 nanometer to 1000 nanometers, said radiation sensitizer is selected from the group consisting of VB–VIB semiconductors, VB–VIIB semiconductors, IIB–VIB semiconductors, IIB–VB semiconductors, IIIB–VB semiconductors, IIIB–VIB semiconductors, IB–VIB semiconductors, and IVB–VIIB semiconductors;

(D) 5 to 90 weight percent of a polymer binder; and (E) 5 to 90 weight percent of metallic particle or ceramic oxide fillers, said metallic filler is selected from group consisting of Al, Ti, V, Cu, Mn, Fe, Co, Ni, Cu, Zn, Y, Zr, Nb, Mo, In, and Sb; said oxide filler is selected from the group consisting of Al, Ti, V, Cu, Mn, Fe, Co, Ni, Cu, Zn, Y, Zr, Nb, Mo, In, Sb, Ta, W, and Si.

4. A light stable composition, that can be polymerized/cross-linked imagewise by ionizing radiation, consisting essentially of:

(A) from 10 to 90 weight percent of a reactive monomer having at least one amide functional group, said monomer selected from the group consisting of:

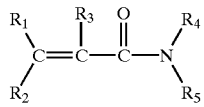

where $R_1$, $R_2$, $R_3$, $R_4$, and $R_5$ are selected from the group consisting of hydrogen; aliphatic groups $C_nH_{2n+1}$ and $CH_{2n-1}$ (n=1 to 20); unsaturated aliphatic groups $C_nH_{2n-1}$ (n=1 to 20); aliphatic groups with aide or acrylamide substituent, and aliphatic groups with R'O— substituent where R' represents aliphatic group, $C_nH_{2n+1}$ and $C_nH_{2n-1}$ (n=1 to 20);

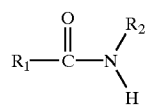

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2-1}$ (n=1 to 20); and acetamide;

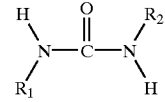

where $R_1$ and $R_2$ are selected from the group consisting of hydrogen; aliphatic groups $C_nH_{2n+1}$ and $C_nH_{2n-1}$ (n=1 to 20), and unsaturated aliphatic groups $C_nH_{2n-1}$ (n=1 to 20);

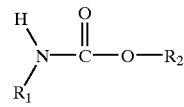

where $R_1$ and $R_2$ are selected from the group consisting of: hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2n-1}$ (n=1 to 20);

(B) from 10 to 90 weight percent of a multifunctional cross-linking agent, said cross-linking agent consists of a backbone having at least 2 functional groups, said backbone is selected from the group consisting of:

(1) linear or branched aliphatic chains, —(CRH)$_n$—, n=1–1000, where R represents an aliphatic group, $C_nH_{2n+1}$ and $C_nH_{2n-1}$ (n=1 to 20);

(2) ethylene glycol chains, —(CH$_2$CH$_2$O)$_n$— where n=1–1000;

(3) propylene glycol chains, —(CH(CH$_3$)CH$_2$O)$_n$— where n=1–1000;

(4) cyclohexyl; and (5) isocyanurate, $C_3N_3O_3$; and wherein the functional groups are selected from the group consisting of:

(a) acrylates,

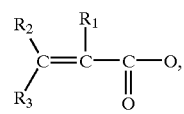

where $R_1$, $R_2$, and $R_3$ are selected from the group consisting of hydrogen and aliphatic groups, $C_nH_{2n+1}$ and $C_nH_{2n-1}$ (n=1 to 20);

(b) carboxylic acid, —COOH;

(c) epoxides,

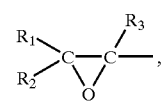

where $R_1$, $R_2$, and $R_3$ are selected from: hydrogen or aliphatic groups, $C_nH_{2n+1}$ and $C_nH_{2n-1}$ (n=1 to 20); and (d) vinyls,

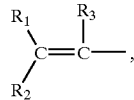

where $R_1$, $R_2$, and $R_3$ are selected from: hydrogen or aliphatic groups, $C_nH_{2n+1}$ and $C_nH_{2n-1}$ (n=1 to 20); and (C) 5–90 weight percent of a polymer binder.

5. A light stable composition, that can be polymerized/cross-linked imagewise by ionizing radiation, consisting essentially of:

(A) from 10 to 90 weight percent of a reactive monomer having at least one amide functional group, said monomer selected from the group consisting of:

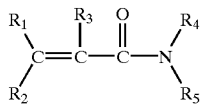

where $R_1$, $R_2$, $R_3$, $R_4$, and $R_5$ are selected from the group consisting of hydrogen; aliphatic groups $C_nH_{2n+1}$ and $C_nH_{2n-1}$ (n=1 to 20); unsaturated aliphatic groups $C_nH_{2n-1}$ (n=1 to 20); aliphatic groups with amide or acrylamide substituent, and aliphatic groups with R'O— substituent where R' represents aliphatic group, $C_nH_{2n+1}$ and $C_nH_{2n-1}$ (n=1 to 20);

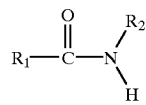

where $R_1$ and $R_2$ are selected from the group consisting of hydrogen; aliphatic groups $C_nH_{2n+1}$ and $C_nH_{2n-1}$ (n=1 to 20); unsaturated aliphatic groups $C_nH_{2-1}$ (n=1 to 20); and acetamide;

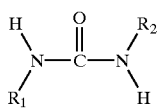

where $R_1$ and $R_2$ are selected from the group consisting of hydrogen; aliphatic groups $C_nH_{2n+1}$ and $C_nH_{2n-1}$ (n=1 to 20); and unsaturated aliphatic groups $C_nH_{2n-1}$ (n=1 to 20);

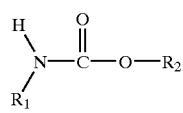

where $R_1$ and $R_2$ are selected from the group consisting of: hydrogen; aliphatic groups $C_nH_{2n+1}$ and $C_nH_{2n-1}$ (n=1 to 20); unsaturated aliphatic groups $C_nH_{2n-1}$ (n=1 to 20); and amino-substituted aliphatic groups, $C_nH_{2n+1}$ and $C_nH_{2-1}$ (n=1 to 20);

(B) from 10 to 90 weight percent of a multifunctional cross-linking agent, said cross-linking agent consists of a backbone having at least 2 functional groups, said backbone selected from the group consisting of:

(1) linear or branched aliphatic chains, —(CRH)$_n$—, n=1–1000, where R represents an aliphatic group, $C_nH_{2n+1}$ and $C_nH_{2n-1}$ (n=1 to 20);
(2) ethylene glycol chains, —(CH$_2$CH$_2$O)$_n$— where n=1–1000;
(3) propylene glycol chains, —(CH(CH$_3$)CH$_2$O)$_n$— where n=1–1000;
(4) cyclohexyl; and
(5) isocyanurate, $C_3N_3O_3$; and wherein the functional groups are selected from the group consisting of:
(a) acrylates,

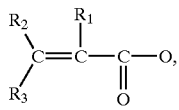

where $R_1$, $R_2$, and $R_3$ are selected from the group consisting of hydrogen and aliphatic groups, $C_nH_{2n+1}$ and $C_nH_{2n-1}$ (n=1 to 20);
(b) carboxylic acid, —COOH;
(c) epoxides,

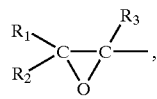

where $R_1$, $R_2$, and $R_3$ are selected from: hydrogen or aliphatic groups, $C_nH_{2n+1}$ and $C_nH_{2n-1}$ (n=1 to 20); and
(d) vinyls,

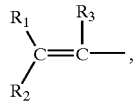

where $R_1$, $R_2$, and $R_3$ are selected from: hydrogen or aliphatic groups, $C_nH_{2n+1}$ and $C_nH_{2n-1}$ (n=1 to 20);

(C) 5 to 90 weight percent of a polymer binder; and
(D) 5 to 90 weight percent of metallic or oxide fillers, said metallic filler is selected from group consisting of Al, Ti, V, Cu, Mn, Fe, Co, Ni, Cu, Zn, Y, Zr, Nb, Mo, In, and Sb; said oxide filler is selected from the group consisting of Al, Ti, V, Cu, Mn, Fe, Co, Ni, Cu, Zn, Y, Zr, Nb, Mo, In, Sb, Ta, W, and Si.

6. The composition of claim 1, 2, 3, 4 or 5 wherein the reactive monomer is selected from the group consisting of acrylamide, methylacrylamide, N-(t-butyl) acrylamide, acetamide, N-cyclohexylacrylamide, N-(3-aminopropyl) methacrylamide, urea, urethane, butylcarbamate, N,N'-methylenebisacrylamide, N-allylacrylamide, N-(iso-butoxymethyl)methylacrylamide, and malonamide.

7. The composition of claim 1, 2, 3, 4 or 5 wherein the multi-functional cross-linking agent is selected from the group consisting of: itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate.

8. The composition of claim 1, 2 or 3 wherein the radiation sensitizer is selected from the group consisting of: $Bi_2S_3$, $Bi_2Se_3$, $BiI_3$, $BiBr_3$, $HgS$, $PbI_2$, $[PbI_4]^{-2}$, and $[Pb_2I_7]^{-3}$.

9. The composition of claim 1, 2, 3, 4 or 5 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(isobutoxymethyl)methylacrylamide, and malonamide; and wherein the multi-functional cross-linking agent is selected from the group consisting of itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate.

10. The composition of claim 1, 2, or 3 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(isobutoxymethyl)methylacrylamide, and malonamide; wherein the multi-functional cross-linking agent is selected from the group consisting of itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate; and wherein the radiation sensitizer is selected from the group consisting of $Bi_2S_3$, $Bi_2Se_3$, $BiI_3$, $BiBr_3$, $HgS$, $PbI_2$, $[PbI_4]^{-2}$, and $[Pb_2I_7]^{-3}$.

11. The composition of claim 2 or 3 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(isobutoxymethyl)methylacrylamide, and malonamide; wherein the multi-functional cross-linking agent is selected from the group consisting of: itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate; wherein the polymer binder is selected from the group consisting of acrylate polymers, acrylate-acrylic acid copolymers, epoxy polymers, polyamides, polyacrylamides, polyvinylalcohol, poly(ethylene)glycol, poly(propylene)glycol, polyethylene, and polyvinylacetate; and wherein the sensitizer is selected from the group consisting of: $Bi_2S_3$, $Bi_2Se_3$, $BiI_3$, $BiBr_3$, $HgS$, $PbI_2$, $[PbI_4]^{-2}$, and $[Pb_2I_7]^{-3}$.

12. The composition of claim 2, 3, 4 or 5 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(isobutoxymethyl)methylacrylamide, and malonamide; wherein the multi-functional cross-linking agent is selected from the group consisting of itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate; and wherein the polymer binder is selected from the group consisting of acrylate polymers, acrylate-acrylic acid copolymers, epoxy polymers, polyamides, polyacrylamides, polyvinylalcohol, poly(ethylene)glycol, poly(propylene)glycol, polyethylene, and polyvinylacetate.

13. The compositions of claim 2, 3, 4 or 5 wherein the polymer binder is selected from the group consisting of acrylate polymers, acrylate-acrylic acid copolymers, epoxy polymers, polyamides, polyacrylamides, polyvinylalcohol, poly(ethylene)glycol, poly(propylene)glycol, polyethylene, and polyvinylacetate.

14. The composition of claim 3 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(isobutoxymethyl)methylacrylamide, and malonamide; wherein the multi-functional cross-linking agent is selected from the group consisting of itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate, wherein the polymer binder is selected from the group consisting of acrylate polymers, acrylate-acrylic acid copolymers, epoxy polymers, polyamides, polyacrylamides, polyvinylalcohol, poly(ethylene)glycol, poly(propylene)glycol, polyethylene, and polyvinylacetate; wherein the filler is selected from the group consisting of aluminum, aluminum oxide, and silicon oxide; and wherein the sensitizer is selected from the group consisting of $Bi_2S_3$, $Bi_2Se_3$, $BiI_3$, $BiBr_3$, $HgS$, $PbI_2$, $[PbI_4]^{-2}$, and $[Pb_2I_7]^{-3}$.

15. The composition of claim 3 or 5 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(isobutoxymethyl)methylacrylamide, and malonamide; wherein the multi-functional cross-linking agent is selected from the group consisting of itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3- epoxypropyl)isocyanurate; and wherein the filler is selected from the group consisting of aluminum, aluminum oxide, and silicon oxide.

16. The composition of claim 3 or 5 wherein the reactive monomer is selected from the group consisting of acrylamide, methylacrylamide, N-(t-butyl)acrylamide, acetamide, N-cyclohexylacrylamide, N-(3-aminopropyl) methacrylamide, urea, urethane, butylcarbamate, N,N'-methylenebisacrylamide, N-allylacrylamide, N-(iso-butoxymethyl)methylacrylamide, and malonamide; wherein the multi-functional cross-linking agent is selected from the group consisting of itaconic acid, malonic acid, polyacrylic acid, 1,4-cyclohexanediol dimethylacrylate, allylmethacrylate, poly(ethyleneglycol)dimethylacrylate, poly(ethyleneglycol)diacrylate, poly(ethyleneglycol) diglycidyl ether, 3-butene-1,2,3-tricarboxylic acid, 1,1,1,-trimethylolpropane trimethacrylate, methyl-2-isocyanato-3-methylbutyrate, triallylisocyanurate, tris(2-acryloxyethyl) isocyanurate, triethylene glycol diacrylate, and tris(2,3-epoxypropyl)isocyanurate; wherein the polymer binder is selected from the group consisting of acrylate polymers, acrylate-acrylic acid copolymers, epoxy polymers, polyamides, polyacrylamides, polyvinylalcohol, poly(ethylene)glycol, poly(propylene)glycol, polyethylene, and polyvinylacetate; and wherein the filler is selected from the group consisting of aluminum, aluminum oxide, and silicon oxide.

17. The composition of claim 3 or 5 wherein the filler is selected from the group consisting of aluminum, aluminum oxide, and silicon oxide.

18. The composition of claim 3 or 5 wherein in polymer binder is selected from the group consisting of acrylate polymers, acrylate-acrylic acid copolymers, epoxy polymers, polyamides, polyacrylamides, polyvinylalcohol, poly(ethylene)glycol, poly(propylene)glycol, polyethylene, and polyvinylacetate; and wherein the filler is selected from the group consisting of aluminum, aluminum oxide, and silicon oxide.

19. The composition of claim 1, 2, 3, 4 or 5 wherein the ionization radiation is selected from the group consisting of x-rays, gamma rays, neutrons, charged particles and electron beam.

* * * * *